US006593592B1

(12) United States Patent
Yamazaki et al.

(10) Patent No.: US 6,593,592 B1
(45) Date of Patent: Jul. 15, 2003

(54) SEMICONDUCTOR DEVICE HAVING THIN FILM TRANSISTORS

(75) Inventors: Shunpei Yamazaki, Tokyo (JP); Takayuki Ikeda, Kanagawa (JP); Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/493,411

(22) Filed: Jan. 28, 2000

(30) Foreign Application Priority Data

Jan. 29, 1999 (JP) .......................................... 11-022298

(51) Int. Cl.[7] .......................................... H01L 27/105
(52) U.S. Cl. .............................. 257/71; 257/59; 257/67; 257/68; 257/72
(58) Field of Search ............................. 257/59, 67, 68, 257/71, 72

(56) References Cited

U.S. PATENT DOCUMENTS

| 4,409,724 A | | 10/1983 | Tasch et al. ................... 438/30 |
| 4,823,180 A | | 4/1989 | Wieder et al. ............... 257/290 |
| 4,851,370 A | | 7/1989 | Doklan et al. ............... 438/762 |
| 4,886,962 A | | 12/1989 | Gofuku et al. ................. 257/53 |
| 5,182,620 A | * | 1/1993 | Shimada et al. ............... 257/72 |
| 5,292,675 A | | 3/1994 | Codama ....................... 438/163 |
| 5,343,066 A | | 8/1994 | Okamoto et al. ............ 257/393 |
| 5,365,079 A | | 11/1994 | Kodaira et al. ................ 257/59 |
| 5,508,209 A | | 4/1996 | Zhang et al. ................. 438/162 |
| 5,608,251 A | | 3/1997 | Konuma et al. ............. 257/337 |
| 5,616,935 A | | 4/1997 | Koyama et al. ............... 257/69 |
| 5,620,905 A | | 4/1997 | Konuma et al. ............. 438/163 |
| 5,643,826 A | | 7/1997 | Ohtani et al. ................ 438/162 |
| 5,712,495 A | | 1/1998 | Suzawa ........................ 257/49 |
| 5,739,549 A | * | 4/1998 | Takemura et al. ............. 257/59 |
| 5,856,689 A | | 1/1999 | Suzawa ...................... 257/296 |
| 5,882,960 A | | 3/1999 | Zhang et al. ................ 438/166 |
| 5,895,933 A | | 4/1999 | Zhang et al. .................. 257/49 |

(List continued on next page.)

FOREIGN PATENT DOCUMENTS

| GB | 2-307-326 | * | 5/1997 | ......... G02F/1/1335 |
| JP | 7-130652 | | 5/1995 | |
| JP | 7-130974 | | 5/1995 | |
| JP | 7-135323 | | 5/1995 | |
| JP | 7-169974 | | 7/1995 | |
| JP | 7-169975 | | 7/1995 | |
| JP | 7-218932 | | 8/1995 | |
| JP | 7-321339 | | 12/1995 | |
| JP | 9-312260 | | 12/1997 | |
| JP | 10-56184 | | 2/1998 | |
| JP | 10-247735 | | 9/1998 | |

OTHER PUBLICATIONS

Shimokawa et al., "Characterization of High–Efficiency Cast–Si Solar Cell Wafers by MBIC Measurement", Japanese Journal of Applied Physics, vol. 27, No. 5, May, 1988, pp. 751–758.

Primary Examiner—George Eckert
(74) Attorney, Agent, or Firm—Nixon Peabody LLP; Jeffrey L. Costellia

(57) ABSTRACT

There is provided a semiconductor device including a storage capacitor having sufficient capacity and a minimum area. The storage capacitor of a pixel region has such a structure that a first storage capacitor and a second storage capacitor are stacked one on top of the other and are connected in parallel with each other. At that time, the first storage capacitor comprises a first capacitance electrode formed in the same layer as a drain region, a first dielectric, and a second capacitance electrode formed in the same layer as a gate wiring. The second storage capacitor comprises the second capacitance electrode, a second dielectric, and a third capacitance electrode formed in the same layer as a light-shielding film.

37 Claims, 23 Drawing Sheets

U.S. PATENT DOCUMENTS

| | | | |
|---|---|---|---|
| 5,923,962 A | | 7/1999 | Ohtani et al. ................ 438/150 |
| 5,942,310 A | * | 8/1999 | Moon ......................... 428/195 |
| 5,998,841 A | | 12/1999 | Suzawa ...................... 257/350 |
| 6,067,132 A | * | 5/2000 | Kim ........................... 349/47 |
| 6,137,551 A | * | 10/2000 | Jeong .......................... 349/38 |
| 6,271,818 B1 | * | 8/2001 | Yamazaki et al. ............ 345/92 |
| 6,490,014 B1 | * | 12/2002 | Ohtani et al. ................. 349/38 |

* cited by examiner

DRIVER CIRCUIT    PIXEL REGION

NTFT    PTFT

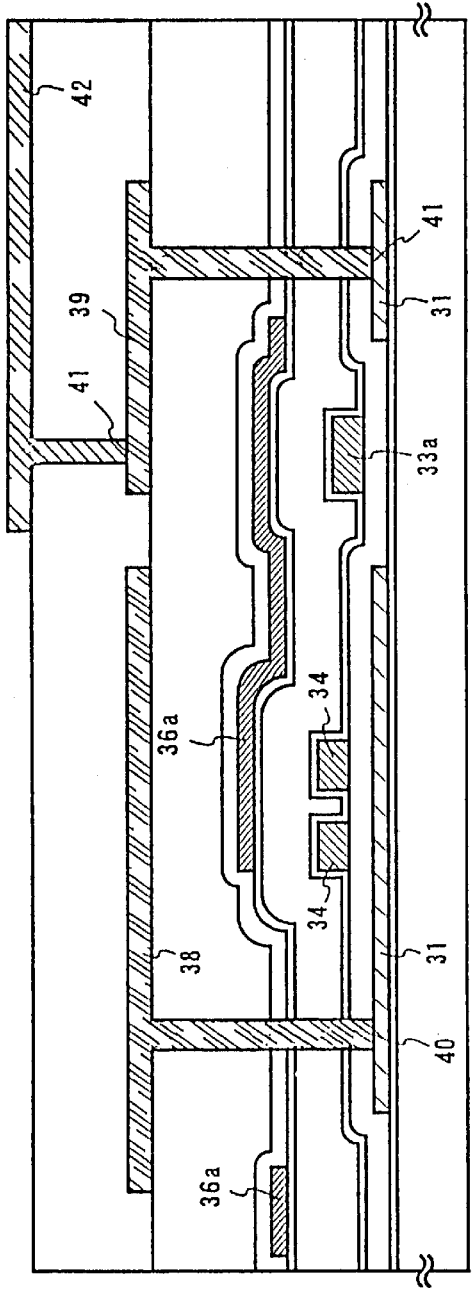
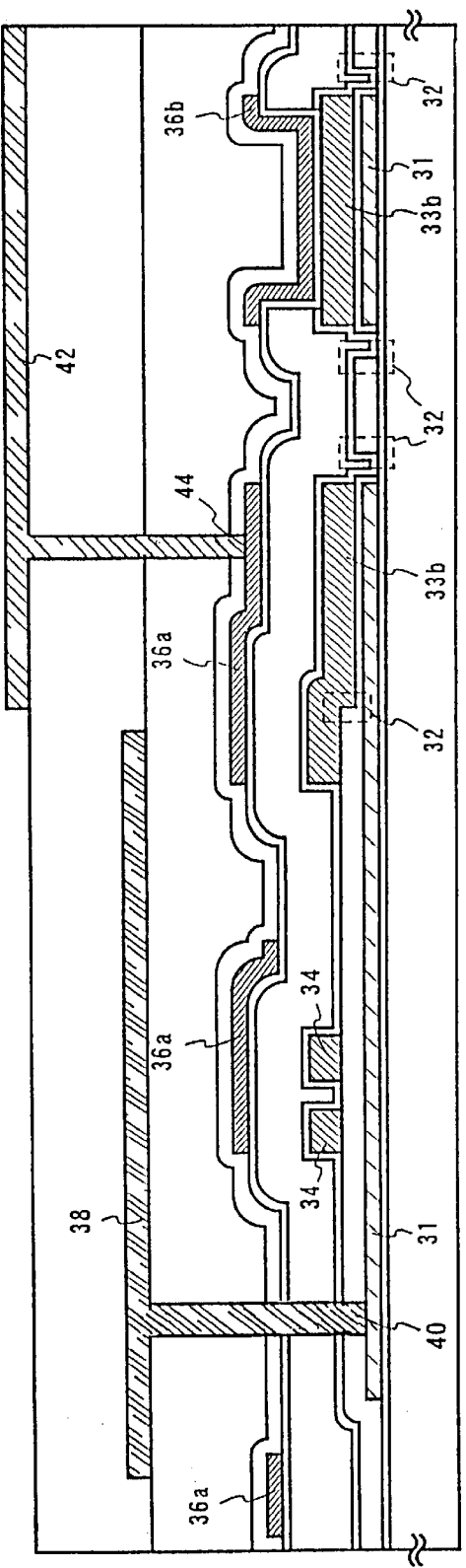
FIG. 17A
FIG. 17B

SEMICONDUCTOR DEVICE HAVING THIN FILM TRANSISTORS

BACKGROUND OF THE INVENTION

1. Field of the Invention

The present invention relates to a semiconductor device including a circuit constituted by thin film transistors (hereinafter referred to as "TFTs"). Particularly the present invention relates to the structure of, for example, an electro-optical device typified by a liquid crystal display device or an EL (electroluminescence) display device, a semiconductor circuit, and an electronic instrument (electronic equipment) using the electro-optical device or the semiconductor circuit of the invention.

Incidentally, the semiconductor device in the present specification indicates any devices functioning by using semiconductor characteristics, and all of the electro-optical device, the semiconductor circuit, and the electronic instrument are included in the semiconductor device.

2. Description of the Related Art

Since a thin film transistor (hereinafter referred to as a "TFT") can be formed on a transparent substrate, development to apply it to an active matrix type liquid crystal display (hereinafter referred to as an "AM-LCD") has been actively made. Since a TFT using a crystalline semiconductor film (typically, polysilicon film) can obtain a high mobility, it is possible to realize a high fineness image display by integrating functional circuits on the same substrate.

Basically, the AM-LCD includes a pixel region (also called a pixel matrix circuit) for displaying an image, a gate driving circuit (also called a gate driver circuit) for driving a TFT of each of pixels arranged in the pixel region, and a source driving circuit (also called a source driver circuit) or a data driving circuit (also called a data driver circuit) for transmitting an image signal to each pixel TFT, which are formed on the same substrate. Incidentally, a region where the gate driver circuit and the source driver circuit are formed is called a driver circuit region.

In recent years, there is proposed a system-on-panel in which in addition to the pixel region and the driver circuit region, a signal processing circuit such as a signal dividing circuit or a γ-correction circuit is also provided on the same substrate.

However, since performance required by a circuit is different between the pixel region and the driver circuit region, it is difficult to satisfy all circuit specifications through TFTs having the same structure. That is, under the present circumstances, such a TFT structure has not been attained that both of a TFT constituting the driver circuit region including a shift register circuit or the like in which importance is attached to a high speed operation and a TFT constituting the pixel region (hereinafter referred to as a "pixel TFT") in which importance is attached to a high withstand voltage characteristic are satisfied at the same time.

SUMMARY OF THE INVENTION

The present applicant filed an application as to such a structure that the thickness of a gate insulating film is made different between a TFT constituting the driver circuit (hereinafter referred to as a "driver TFT") and the pixel TFT (Japanese Patent Application Laid-open No. Hei 10-056184, corresponding to U.S. patent application Ser. No. 08/862,895 U.S. Pat. No. 6,316,787). Specifically, the gate insulating film of the driver TFT is made thinner than the gate insulating film of the pixel TFT.

Based on the structure disclosed in the foregoing publication, the present invention makes an improvement with respect to a pixel region. Specifically, an object of the present invention is to provide a structure for forming a storage capacitor which can secure large capacity with a small area.

Another object of the invention is to provide an electro-optical device, typified by an AM-LCD, having high reliability by forming each circuit of the electro-optical device with a TFT having a suitable structure according to its function. Still another object of the invention is to raise reliability of a semiconductor device (electronic instrument) including such an electro-optical device as a display portion.

According to a structure of the present invention disclosed in the present specification, a semiconductor device comprises a pixel region including a pixel TFT and a storage capacitor, and a driver circuit region for driving the pixel region, and is characterized in that:

the storage capacitor is formed of a first storage capacitor and a second storage capacitor connected in parallel with each other;

the first storage capacitor is formed of a first capacitance electrode electrically connected to an active layer of the pixel TFT, a first dielectric, and a second capacitance electrode, and the second storage capacitor is formed of the second capacitance electrode, a second dielectric, and a third capacitance electrode; and the first capacitance electrode and the third capacitance electrode are electrically connected to each other through a pixel electrode.

In the above structure, as the first dielectric or the second dielectric, an insulating film containing silicon can be used, and it is preferable that the thickness of the first dielectric or the second dielectric is set to 5 to 50 nm (preferably 10 to 30 nm).

In the above structure, by using, as the second capacitance electrode, a gate wiring (gate wiring not selected) adjacent to a gate wiring (gate wiring selected) to which a signal is given, it is possible to prevent an opening ratio (ratio of an area which can be used for image display in a transmission type liquid crystal display device) from lowering.

According to another structure of the present invention, a semiconductor device comprises an active layer, a gate wiring provided opposite to the active layer with a first dielectric interposed therebetween, a first interlayer insulating film covering the gate wiring, an opening portion provided in the first interlayer insulating film, a second dielectric covering the opening portion, a light-shielding film provided opposite to the gate wiring with the second dielectric interposed therebetween, a second interlayer insulating film covering the light-shielding film, a source wiring or a drain wiring on the second interlayer insulating film, a third interlayer insulating film covering the source wiring or the drain wiring, and a pixel electrode on the third interlayer insulating film, and is characterized in that the active layer and the gate wiring form a first storage capacitor with the first dielectric interposed therebetween, the gate wiring and the light-shielding film form a second storage capacitor with the second dielectric interposed therebetween, and in that the active layer and the light-shielding film are electrically connected through the pixel electrode.

Also in the above structure, as the first dielectric or the second dielectric, it is possible to use an insulating film having a thickness of 5 to 50 nm (preferably 10 to 30 nm) and containing silicon.

A gate insulating film of a pixel TFT is selectively etched and is removed in a region where the storage capacitor is formed. Thereafter, a thin insulating film (first dielectric) having a thickness of 5 to 50 nm (preferably 10 to 30 nm) is newly formed on the surface of the active layer of the region. That is, the thickness of the gate insulating film of the pixel TFT is thicker than the thickness of the first dielectric.

Moreover, the first interlayer insulating film is also selectively etched in the region where the storage capacitor is formed. Then, an insulating film having a thickness of 5 to 50 nm (preferably 10 to 30 nm) and containing silicon is newly formed to serve as the second dielectric.

According to still another structure of the present invention, a method of fabricating a semiconductor device comprises:

a first step of forming an active layer over a substrate;

a second step of forming an insulating film containing silicon on the active layer;

a third step of exposing a part of the active layer by removing a part of the insulating film containing silicon;

a fourth step of forming a first dielectric on the active layer exposed in the third step;

a fifth step of forming a gate wiring and a second capacitance electrode on the insulating film containing silicon and on the first dielectric;

a sixth step of forming a first interlayer insulating film on the gate wiring and the second capacitance electrode;

a seventh step of exposing a part of the second capacitance electrode by removing a part of the first interlayer insulating film;

an eighth step of forming a second dielectric on the second capacitance electrode exposed in the seventh step;

a ninth step of forming a light-shielding film on the first interlayer insulating film and the second dielectric;

a tenth step of forming a second interlayer insulating film on the light-shielding film;

an eleventh step of forming a source wiring or a drain wiring on the second interlayer insulating film;

a twelfth step of forming a third interlayer insulating film on the source wiring or the drain wiring; and a thirteenth step of forming a pixel electrode, on the third interlayer insulating film, electrically connected with the light-shielding film and the drain wiring.

In the above structure, it is preferable that an insulating film formed by a thermal CVD method (typically, a low pressure thermal CVD method) and containing silicon is used for the first dielectric or the second dielectric. This is because, since the thickness of the first dielectric or the second dielectric is as thin as 5 to 50 nm, it is preferable to use a high quality film formed by the thermal CVD method.

BRIEF DESCRIPTION OF THE DRAWINGS

FIGS. 17A and 17B are views respectively showing a sectional structure of a pixel region.

DETAILED DESCRIPTION OF THE PREFERRED EMBODIMENT

Figure 1:
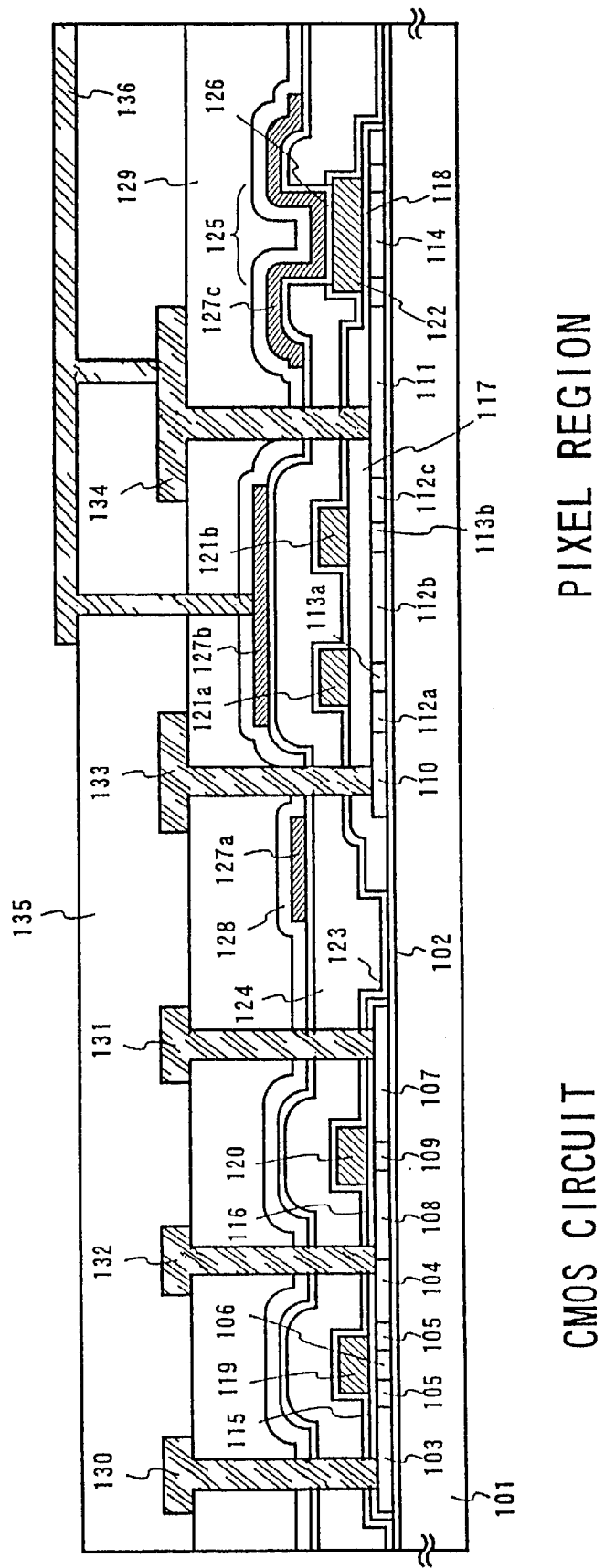
FIG. 1 is a view showing a sectional structure of an AM-LCD.

A mode for carrying out the present invention will be described with reference to FIG. 1. FIG. 1 is a sectional view of an AM-LCD in which a driver circuit region and a pixel region are integrally formed on the same substrate. Here, a CMOS circuit is shown as a basic circuit constituting the driver circuit region, and a TFT with a double gate structure is shown as a pixel TFT. Of course, the pixel TFT is not limited to the double gate structure, but a single gate structure or a multi-gate structure such as a triple gate structure may be adopted.

In FIG. 1, reference numeral 101 designates a substrate having heat resistance, and a quartz substrate, a silicon substrate, a ceramic substrate, or a metal substrate (typically, a stainless substrate) may be used. In any case of using any substrate, a base film (preferably an insulating film containing silicon as its main ingredient) may be provided as the need arises.

Reference numeral 102 designates a silicon oxide film provided as a base film, to and a semiconductor film which becomes an active layer of a driver TFT, an active layer of a pixel TFT, and a lower electrode of a storage capacitor is formed thereon. Incidentally, in the present specification, an "electrode" is a part of a "wiring", and indicates a portion where electrical connection to another wiring is made or a portion where the wiring intersects with a semiconductor film. Thus, although "wiring" and "electrode" are discriminated in use for convenience's sake in explanation, the term "wiring" always includes the meaning of "electrode".

In FIG. 1, the active layer of the driver TFT is formed of a source region 103, a drain region 104, an LDD (Lightly Doped Drain) region 105, and a channel forming region 106 of an N-channel TFT (hereinafter referred to as an "NTFT"), and a source region 107, a drain region 108, and a channel forming region 109 of a P-channel TFT (hereinafter referred to as a "PTFT").

The active layer of the pixel TFT (here, an NTFT is used) is formed of a source region 110, a drain region 111, LDD regions 112a to 112c, and channel forming regions 113a and 113b. Further, the semiconductor film (semiconductor film formed in the same layer as the drain region 111) extended from the drain region 111 is used a lower electrode (first capacitance electrode) 114 of a lower storage capacitor. Incidentally, it is sufficient if the first capacitance electrode 114 is electrically connected to the drain region 111.

Since the first capacitance electrode is actually the semiconductor film, carriers are induced by applying a predetermined voltage to an opposite electrode, so that it functions as an electrode. However, in the present specification, as a matter of convenience in explanation, the film is treated as an electrode, and will be referred to as the "first capacitance electrode".

Although a gate insulating film is formed to cover the active layer and the first capacitance electrode, in the present invention, a gate insulating film 115 (NTFT side) and 116 (PTFT side) of the driver TFT are formed to be thinner than a gate insulating film 117 of the pixel TFT. It is appropriate that typically, the thickness of the gate insulating films 115 and 116 is set to 5 to 50 nm (preferably 10 to 30 nm), and the thickness of the gate insulating film 117 is set to 50 to 200 nm (preferably 100 to 150 nm).

It is not necessary that the gate insulating films of the driver TFTs have only one kind of thickness. That is, it does not matter if driver TFTs having different insulating films exist in the driver circuit. In that case, at least three kinds of TFTs having different gate insulating films exist on the same substrate.

A dielectric (first dielectric) 118 of the lower storage capacitor may be formed of an insulating film that is formed at the same time as the gate insulating films 115 and 116 of the driver TFT. That is, such a structure may be adopted that the gate insulating film of the driver TFT and the dielectric of the storage capacitor are formed of the same insulating film having the same thickness. Of course, although a portion obtained by extending the gate insulating film 117 as it may be used as the first dielectric 118, a large capacity can be obtained if a thin insulating film is used as shown in FIG. 1, which is advantageous.

Incidentally, there can be such a case that the thickness of the gate insulating film of the driver TFT is different from the thickness of the first dielectric, and they are different from the thickness of the gate insulating film of the pixel TFT. For example, there is a case where the driver TFT (a circuit especially required to perform a high speed operation) includes the gate insulating film having a thickness of 5 to 10 nm, the pixel TFT includes the gate insulating film having a thickness of 100 to 150 nm, and the storage capacitor includes the dielectric having a thickness of 30 to 50 nm.

When the dielectric of the storage capacitor is made thin as described above, a larger capacity can be obtained without increasing the area for formation of the capacitance. This structure of the storage capacitor is not disclosed in Japanese Patent Application Laid-open No. Hei 10-056184 mentioned above. Besides, such an advantage is obtained that fabricating steps of the TFT are not increased.

Next, gate wirings 119 and 120 of the driver TFT and gate wirings 121a and 121b of the pixel TFT are formed on the gate insulating films 115 to 117. At the same time, an upper electrode (second capacitance electrode) 122 of the lower storage capacitor is formed on the first dielectric 118. That is, the second capacitance electrode 122 is formed in the same layer as the gate wirings 119, 120, 121a, and 121b. At this time, the lower storage capacitor (first storage capacitor) is formed of the first capacitance electrode 114, the first dielectric 118, and the second capacitance electrode 122.

It is preferable that a gate wiring (a wiring not selected is used) of the pixel TFT is used also as the second capacitance electrode 122. By this, it is possible to suppress lowering of the opening ratio of the pixel region. In this case, the first storage capacitor is formed of the active layer and the gate wiring provided opposite to the active layer with the interposed first dielectric 118 interposed therebetween.

As a constituent material of the gate wirings 119 to 121 and the second capacitance electrode 122, a conductive film having heat resistance capable of withstanding a temperature of 800 to 1150° C. (preferably 900 to 1100° C.) is used.

Typically, a silicon film having conductivity (for example, a phosphorus doped silicon film, a boron doped silicon film, etc.), or a metal film (for example, a tungsten film, a tantalum film, a molybdenum film, a titanium film, etc.) may be used. Further, a silicide film obtained through formation of silicide of the foregoing metal film, or a nitride film obtained through formation of nitride of the metal film (a tantalum nitride film, a tungsten nitride film, a titanium nitride film, etc.) may be used. These films may be freely combined to obtain a laminate.

In the case where the metal film is used, in order to prevent oxidation of the metal film, it is desirable to make a laminate structure with the silicon film. In view of prevention of oxidation, such a structure as to cover the metal film with an insulating film containing silicon is effective. As the insulating film containing silicon, a silicon oxide film, a silicon nitride film, or a silicon oxide nitride film (also called silicon nitride oxide film) may be used. The silicon oxide nitride film is an insulating film containing oxygen, nitrogen, and silicon at a predetermined ratio. In FIG. 1, a silicon nitride film is provided as a protective film 123 to prevent oxidation of the gate wirings.

When the gate wiring is formed of the foregoing material, a gate wiring pattern can be formed in such a manner that an insulating film containing silicon is provided at the uppermost layer at the time of film formation, and the insulating film containing silicon and the foregoing material are etched at the same time. In this case, such a state is obtained that only the upper surface of the gate wiring is protected with the insulating film containing silicon.

Next, reference numeral 124 designates a first interlayer insulating film, and is formed of an insulating film (single layer or laminate layer) containing silicon. In the first interlayer insulating film 124, an opening portion 125 is provided over the second capacitance electrode 122. A dielectric (second dielectric) 126 of an upper storage capacitor is formed to cover the opening portion 125. As the second dielectric 126, an insulating film (single layer or laminate layer) containing silicon as described before may be used. The second capacitance electrode 122 functions also as a lower electrode of the upper storage capacitor.

Next, light-shielding films 127a to 127c provided opposite to the second capacitance electrode (in some cases, opposite to a gate wiring) so that the second dielectric 126 is sandwiched therebetween, are formed on the second dielectric 126. The light-shielding films 127a to 127c have the same potential, and especially the is portion designated by 127c functions as an upper electrode (third capacitance electrode) of the upper storage capacitor. That is, the third capacitance electrode 127c is formed in the same layer as the light-shielding film. As a result, the upper storage capacitor (second storage capacitor) is formed of the second capacitance electrode 122, the second dielectric 126, and the third capacitance electrode 127c.

A passivation film 128 and a second interlayer insulating film 129 are formed thereon. Source wirings 130 and 131 and a drain wiring 132 of the driver TFT, and a source wiring 133 and a drain wiring 134 of the pixel TFT are formed on the second interlayer insulating film 129 through contact holes. A third interlayer insulating film 135 covering those wirings is formed thereon, on which a pixel electrode 136 is formed.

As the second interlayer insulating film 129 or the third interlayer insulating film 135, a resin film having a low relative dielectric constant is preferable. As the resin film, a polyimide film, an acrylic film, a polyamide film, a BCB (benzocyclobutene) film, or the like may be used.

The pixel electrode 136 is connected with the light-shielding film 127b (, or 127a or 127c) and the drain wiring 134 of the pixel TFT through contact holes. That is, the light-shielding films 127a to 127c are electrically connected with the drain wiring 134, the drain region 111, and the first capacitance electrode 114 through the pixel electrode and comes to have the same potential.

As the pixel electrode 136, a transparent conductive film typified by an ITO film may be used when a transmission type AM-LCD is fabricated, and a metal film having high reflectivity, representative of which is an aluminum film, may be used when a reflection type AM-LCD is fabricated.

In FIG. 1, although the pixel electrode 136 is electrically connected with the drain region 111 of the pixel TFT through the drain electrode 134, such a structure may be adopted that the pixel electrode 136 and the drain region 111 are directly connected with each other.

As described above, in FIG. 1, the lower storage capacitor (first storage capacitor) comprises the first capacitance electrode 114 made of the semiconductor film having the same composition as the active layer, the first dielectric 118, and the second capacitance electrode 122 comprising the same layer as the gate wiring. The upper storage capacitor (second storage capacitor) is formed of the second capacitance electrode 122, the second dielectric 126, and the third capacitance electrode 127c comprising the same layer as the light-shielding film.

Since the first storage capacitor and the second storage capacitor are connected in parallel with each other, a storage capacitor having a very large capacity can be realized with a small area. Besides, by using a very thin insulating film as the first dielectric 118 or the second dielectric 126, the capacity can be further increased.

The present invention having the foregoing structure will be described in more detail through the following embodiments.

[Embodiment 1]

In this embodiment, fabricating steps for realizing the structure of FIG. 1 described in the mode for carrying out the present invention will be described with reference to FIGS. 2A to 5B.

Figure 2A:
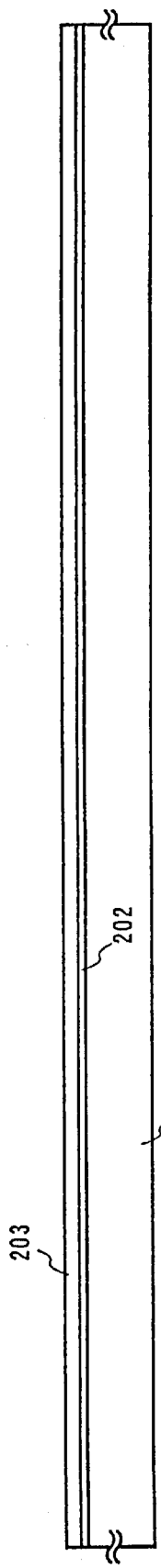
FIGS. 2A to 2D are views showing fabricating steps of an AM-LCD.

First, a quartz substrate 201 is prepared as a substrate, and a silicon oxide film 202 having a thickness of 20 nm and an amorphous silicon film 203 are continuously formed thereon without being open to the air. By doing so, it is possible to prevent an impurity such as boron contained in the air from being adsorbed to the lower surface of the amorphous silicon film (FIG. 2A).

In this embodiment, although the amorphous silicon film is used, another semiconductor film may be used. A microcrystal silicon film may be used, or an amorphous silicon germanium film may be used. In view of a subsequent thermal oxidation step as well, the film is formed to have a final thickness of 25 to 40 nm.

Next, crystallization of the amorphous silicon film is carried out. In this embodiment, as crystallizing means, a technique disclosed in Japanese Patent Application Laid-open No. Hei 9-312260 is used. According to the technique disclosed in the publication, an amorphous silicon film is crystallized through solid phase growth using an element selected from nickel, cobalt, palladium, germanium, platinum, iron, and copper as a catalytic element for promoting crystallization.

Figure 2B:
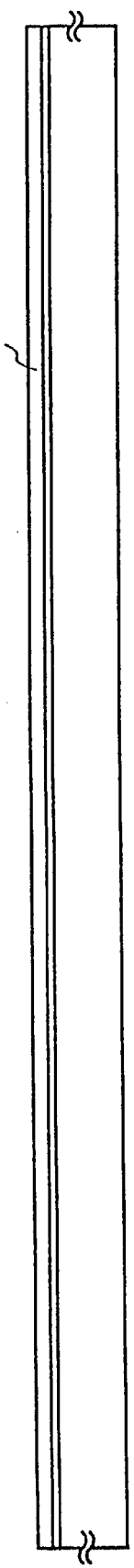

In this embodiment, nickel is selected as the catalytic element, a layer (not shown) containing nickel is formed on the amorphous silicon film 203, and a heat treatment at 550° C. for 4 hours is carried out to perform crystallization. Then, a crystalline silicon (polysilicon) film 204 is obtained (FIG. 2B).

Here, an impurity element (phosphorus or boron) for controlling a threshold voltage of a TFT may be added to the crystalline silicon film 204. Phosphorus and boron may be separately added, or only either one of them may be added. At this time, if phosphorus is previously added to the region which becomes in the end the first capacitance electrode of the storage capacitor, the region later becomes easy to use as to an electrode, which is preferable.

Next, a mask film 205 having a thickness of 100 nm and comprising silicon oxide is formed on the crystalline silicon film 204, and resist masks 206a and 206b are formed thereon. Further, the mask film 205 is etched using the resist masks 206a and 206b as masks, so that opening portions 207a and 207b are formed.

Figure 2C:
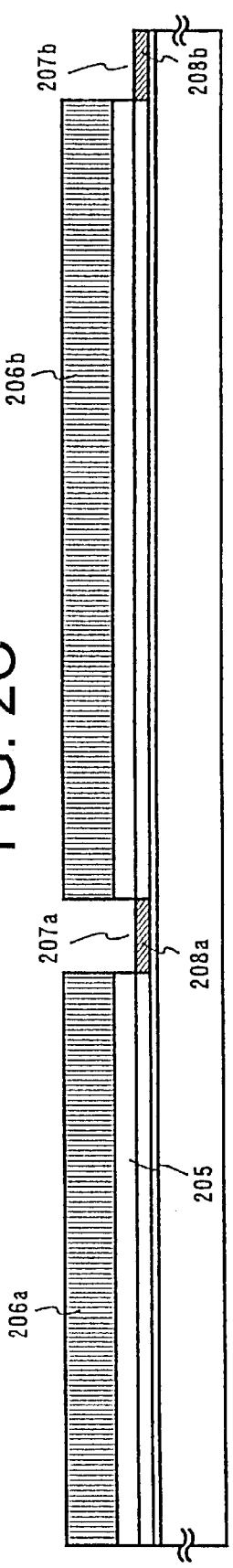

In this state, an element (in this embodiment, phosphorus) in group 15 of the periodic table is added so that phosphorus doped regions (phosphorus added regions) 208a and 208b are formed. It is preferable that the concentration of phosphorus to be added is $5 \times 10^{18}$ to $1 \times 10^{20}$ atoms/cm$^3$ (preferably $1 \times 10^{19}$ to $5 \times 10^{19}$ atoms/cm$^3$). However, since the concentration of phosphorus to be added varies depending on temperature and time in a subsequent gettering step, and further, on the area of a phosphorus doped region, the concentration is not limited to this concentration range (FIG. 2C).

Next, the resist masks 206a and 206b are removed, and a heat treatment at 450 to 650° C. (preferably 500 to 600° C.) is carried out for 2 to 16 hours, so that gettering of nickel remaining in the crystalline silicon film is made. In order to obtain the gettering action, a temperature of about ±50° C. from the maximum temperature in the heat hysteresis is necessary. Since the heat treatment for crystallization is carried out at 550 to 600° C., the gettering action can be sufficiently obtained by a heat treatment at 500 to 650° C.

Figure 2D:
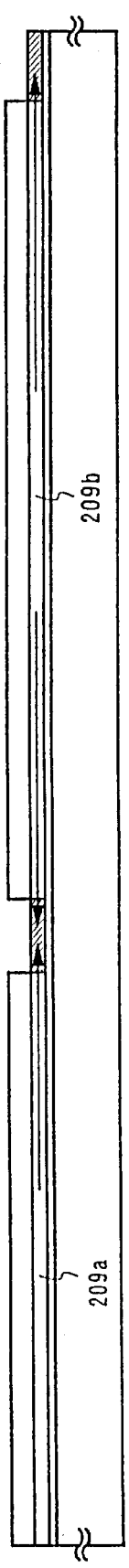

In this embodiment, a heat treatment at 600° C. for 8 hours is carried out, so that nickel is moved in the directions of arrows (see FIG. 2D) and is gettered into the phosphorus doped regions 208b and 208b. In this way, the concentration of nickel remaining in crystalline silicon films 209a and 209b is reduced to $2\times10^{17}$ atoms/cm$^3$ or less (preferably $1\times10^{16}$ atoms/cm$^3$ or less). However, this concentration is a measurement result of Secondary Ion Mass Spectroscopy (SIMS), and a concentration lower than this can not be ascertained because of the limit of measurement under the present circumstances (FIG. 2D).

After the gettering step of nickel is ended in this way, the crystalline silicon films 209a and 209b are patterned, so that an active layer (semiconductor film) 210 of a CMOS circuit and an active layer 211 of the pixel TFT are formed. At that time, it is desirable to completely remove the phosphorus added regions in which nickel was captured.

Figure 3A:
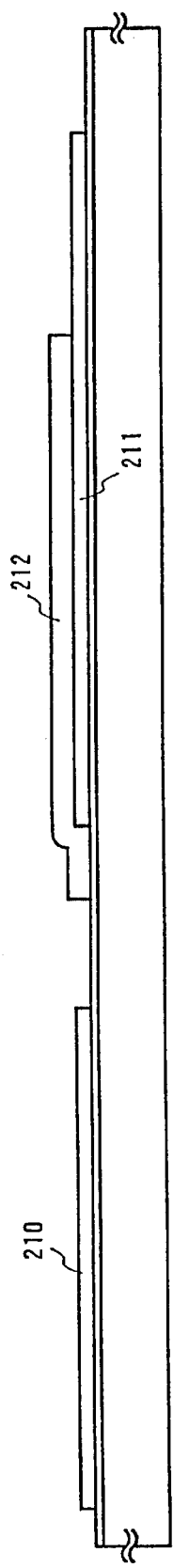
FIGS. 3A to 3D are views showing fabricating steps of the AM-LCD.

Then, an insulating film (not shown) is formed by a plasma CVD method or a sputtering method, and patterning is carried out so that a gate insulating film 212 is formed. This gate insulating film is an insulating film which comes to fuinction as a gate insulating film of the pixel TFT, and the film thickness is set to 50 to 200 nm. In this embodiment, a silicon oxide film with a thickness of 75 nm is used. Other insulating film containing silicon may be used to form a single layer or a laminate layer (FIG. 3A).

At this time, the gate insulating film 212 is formed in such a manner that the insulating film is left after the patterning over the pixel TFT, and portions over regions which become the CMOS circuit and the storage capacitor are removed. In this embodiment, although the description has been made only with the CMOS circuit, the film over a region which becomes a part (a circuit group especially required to perform a high speed operation) of the driver circuit region is actually removed. Thus, in the case of a circuit, such as a buffer circuit, in which a high voltage is applied to a gate insulating film, it is desirable to leave the insulating film having the same thickness as the gate insulating film 212.

In the state where a part of the active layer is exposed in this way, a heat treatment step at 800 to 1150° C. (preferably 900 to 1100° C.) for 15 minutes to 8 hours (preferably 30 minutes to 2 hours) is carried out in an oxidizing atmosphere (thermal oxidation step). In this embodiment, a heat treatment at 950° C. for 30 minutes is carried out in an oxygen atmosphere.

As the oxidizing atmosphere, although both a dry oxygen atmosphere and a wet oxygen atmosphere may be used, the dry oxygen atmosphere is suitable for reduction of crystal defects in a semiconductor film. Also, an atmosphere in which a halogen element is contained in an oxygen atmosphere may be used. Since an effect of removing nickel is also expected in the thermal oxidation step using the atmosphere containing the halogen element, this atmosphere is effective.

By carrying out the thermal oxidation step in this way, silicon oxide films (thermal oxidation films) 213 and 214 having a thickness of 5 to 50 nm (preferably 10 to 30 nm) are formed on the portion (active layer exposed by removing the gate insulating film) where the gate insulating film 212 does not exist. In the end, the silicon oxide film 213 functions as a gate insulating film of the CMOS circuit, and the silicon oxide film 214 functions as a first dielectric of a first storage capacitor.

An oxidation reaction proceeds also at the interface between the gate insulating film 212 comprising silicon oxide remaining in the pixel TFT and the semiconductor film 211 thereunder. For that reason, the final thickness of a gate insulating film 215 of the pixel TFT becomes 50 to 200 nm (preferably 100 to 150 nm). In this embodiment, the thickness becomes 80 nm.

Incidentally, in this embodiment, although the silicon oxide films 213 and 214 are formed by the thermal oxidation method, a thin silicon oxide film may be formed by a low pressure thermal CVD method. In that case, it is appropriate that film formation temperature is set to about 800° C., and silane and oxygen are used as a film formation gas.

After the thermal oxidation step is completed in this way, gate wirings 216 (NTFT side) and 217 (PTFT side) of the CMOS circuit, gate wirings 218a and 218b of the pixel TFT, and a second capacitance electrode 219 are formed. With respect to the gate wirings 218a and 218b, although the two gate wirings are shown since the pixel TFT has a double gate structure, they are actually the same wiring.

It is preferable that a gate wiring (gate wiring not selected) of an adjacent pixel is used also as the gate capacitance electrode 219. Of course, it is also possible to separately form a wiring (capacitance electrode) for capacity formation in parallel with the gate wiring.

In this embodiment, as the gate wirings 216 to 218 and the second capacitance electrode 219, a laminate film of a silicon film (made to have conductivity)/tungsten nitride film/tungsten film in this order from the lower layer (or a laminate film of silicon film/tungsten silicide film in this order from the lower layer) is used. Of course, it is needless to say that the other conductive film explained in the mode for carrying out the present invention can also be used. In this embodiment, the thickness of the respective gate wirings is set to 250 nm.

In this embodiment, the silicon film of the lowermost layer is formed by using a low pressure thermal CVD method. Since the gate insulating film of the CMOS circuit is as thin as 5 to 50 nm, in the case where a sputtering method or a plasma CVD method is used, there is a fear that damage is caused to the semiconductor film (active layer) depending on conditions. Thus, it is preferable to use the thermal CVD method in which a film can be formed by a chemical vapor reaction.

At this time of point, the first storage capacitor is formed of the active layer 211 (a part of which subsequently becomes a first capacitance electrode), the first dielectric 214, and the second capacitance electrode.

Next, a SiNxOy (typically, x=0.5 to 2, y=0.1 to 0.8) film having a thickness of 25 to 50 nm is formed as a protective film 220 to cover the gate wirings 216 to 218 and the second capacitance electrode 219. This protective film 220 prevents oxidation of the gate wirings 216 to 218, and at the same time, functions as an etching stopper when a side wall comprising silicon is removed later. Incidentally, it is effective in reduction of pin holes that the film formation step is divided and carried out in two steps.

At this time, it is effective to carry out a plasma treatment using gas containing hydrogen (in this embodiment, ammonia gas) as a pretreatment to the formation of the protective film 220. Since hydrogen activated (excited) by plasma in this pretreatment is confined in the active layer (semiconductor layer), hydrogen termination is effectively carried out.

Further, when a nitrous oxide gas is added in addition to the gas containing hydrogen, the surface of an object to be treated is cleaned by generated moisture, and especially contamination caused by boron or other contaminants present in the air can be effectively prevented.

Of course, instead of the SiNxOy film, a silicon oxide film, a silicon nitride film, or a laminate film of those may be used as the protective film 220.

Figure 3B:
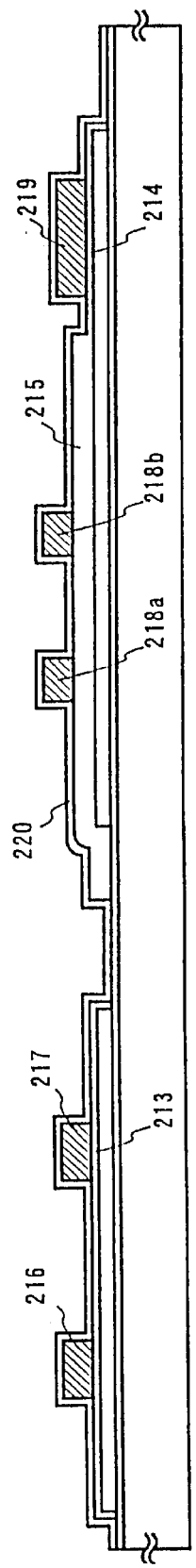

In this way, the state of FIG. 3B is obtained. Next, an amorphous silicon film (not shown) is formed, and anisotropic etching by a chlorine based gas is carried out, so that side walls 221 to 224 are formed. After the side walls 221 to 224 are formed, a resist mask 225 is formed on the gate wiring of the pixel TFT. By this resist mask 225, a position of a contact portion between an LDD region and a source region (or a drain region) of the pixel TFT is determined. Substantially, the length of the LDD region is determined.

Incidentally in this embodiment, although the silicon film is used as a constituent material of the side wall, a silicon oxide film or a silicon oxide nitride film may be used. If a silicon oxide film or a silicon oxide nitride film is used as the protective film 220, a silicon nitride film may be used for the side wall.

Next, an adding step of an element in group 15 of the periodic table (in this embodiment, phosphorus) is carried out to the semiconductor films 210 and 211. At this time, the gate wirings 216 to 218, the second capacitance electrode 219, the side walls 221 to 224, and the resist mask 225 serve as masks, so that impurity regions 226 to 230 are formed in a self-aligning manner. The concentration of phosphorus added to the impurity regions 226 to 230 are adjusted to $5 \times 10^{19}$ to $1 \times 10^{21}$ atoms/cm$^3$. In this specification, the concentration of phosphorus at this time is expressed by (n+) (FIG. 3C).

This step may be carried out separately for a thin portion of the gate insulating film and for a thick portion of the gate insulating film, or may be carried out for both portions at the same time. Also, the adding step of phosphorus may be carried out by an ion implantation method in which mass separation is carried out, or by a plasma doping method in which mass separation is not carried out. With respect to conditions such as an acceleration voltage or dose amount, optimum values may, be set by an operator.

Figure 3C:
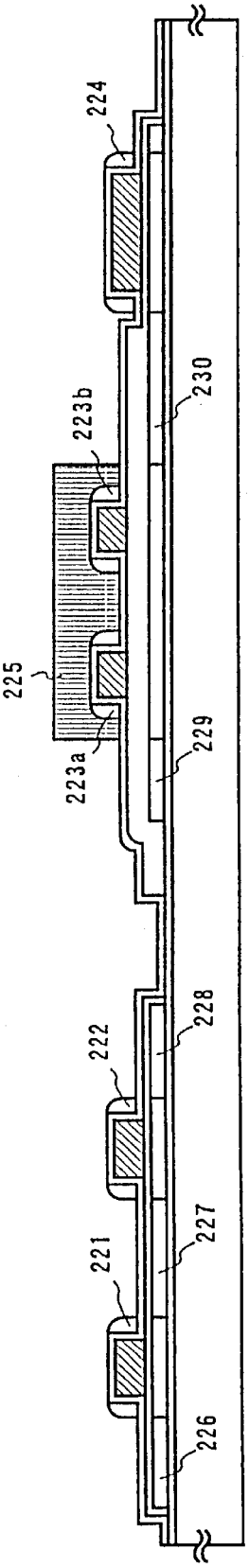
Figure 3D:
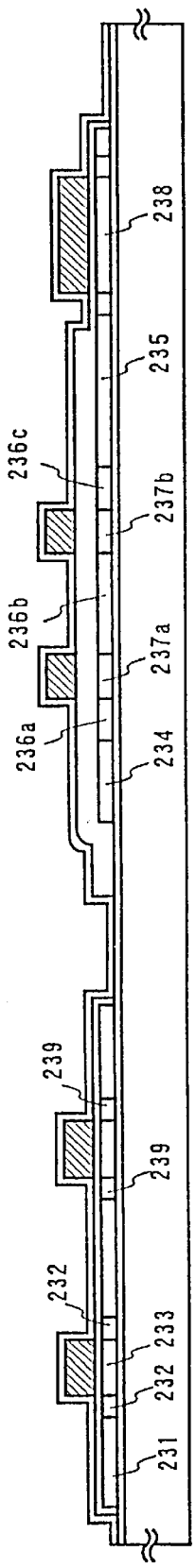

After the state of FIG. 3C is obtained in this way, the resist mask 225 and the side walls 221 to 224 are removed, and an adding step of phosphorus is again carried out. In this step, addition is made at a dose amount less than in the previous adding step of phosphorus. In this way, low concentration impurity regions are formed in the regions where phosphorus has not been added due to the masks of the side walls 221 to 224 and the resist mask 225 in the previous step. The concentration of phosphorus added to the low concentration impurity regions is adjusted to $5 \times 10^{17}$ to $1 \times 10^{18}$ atoms/cm$^3$. In the present specification, the concentration of phosphorus at this time is expressed by (n−) (FIG. 3D).

Of course, this step may also be carried out separately for a thin portion of the gate insulating film and for a thick portion of the gate insulating film, or may be carried out for both portions at the same time. Also, the adding step of phosphorus may be carried out by an ion implantation method in which mass separation is carried out, or by a plasma doping method in which mass separation is not carried out. With respect to conditions such as an acceleration voltage or dose amount, optimum values may be set by an operator.

However, since the low concentration impurity regions come to function as LDD regions, it is necessary to carefully carry out control of phosphorus concentration. Then, in this embodiment, a plasma doping method is used, and the concentration is set so as to obtain the distribution of concentration (concentration profile) of added phosphorus as shown in FIG. 6.

Figure 6:
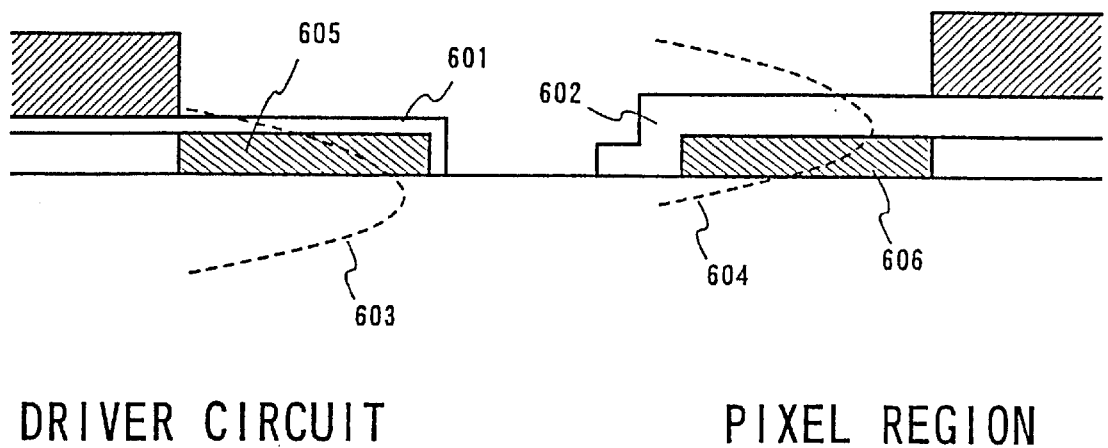
FIG. 6 is a view showing the relation in concentration distribution when impurity elements are added.

In FIG. 6, the thickness of a gate insulating film 601 on the driver circuit side is different from the thickness of a gate insulating film 602 on the pixel region side. Thus, the distribution of concentration of added phosphorus in the depth direction becomes different.

In this embodiment, the addition condition (acceleration voltage, etc.) of phosphorus is adjusted so that a concentration distribution 603 is obtained on the driver circuit side and a concentration distribution 604 is obtained on the pixel region side. In this case, although the concentration distributions in the depth direction are different from each other, the phosphorus concentrations of impurity regions 605 and 606 formed consequently become almost equal to each other.

Incidentally, the step shown in FIG. 6 can be used for all impurity addition steps set forth in the present specification.

By this step, a source region 231, an LDD region 232, and a channel forming region 233 of the NTFT forming the CMOS circuit are defined. Besides, a source region 234, a drain region 235, LDD regions 236a to 236c, and channel forming regions 237a and 237b of the pixel TFT are defined. Further, a first capacitance electrode 238 is defined.

Incidentally, in this embodiment, although only the low concentration impurity region (n− region) is formed between the channel forming regions 237a and 237b, a high concentration impurity region (n+ region) may be formed between the channel forming regions 237a and 237b by providing a gap in the resist mask 225.

In the case of this embodiment, the first capacitance electrode 238 is formed of a semiconductor region having the same composition as the channel forming region 237a or 237b, and is intrinsic or substantially intrinsic. Incidentally, it is permissible to consider that a region intentionally added with phosphorus or boron for control of a threshold voltage is substantially intrinsic.

In this embodiment, although the example in which the LDD regions are formed using the side walls is described, it is also possible to form the LDD regions by a normal method using a resist mask. In that case, although the number of masks (or the number of steps) is increased, there is an advantage that the degree of freedom concerning the design of the width (length) of an LDD region or formation position thereof is increased.

Also in the region which becomes the PTFT of the CMOS circuit, a low concentration impurity region 239 is formed similar to the NTFT.

Figure 4A:
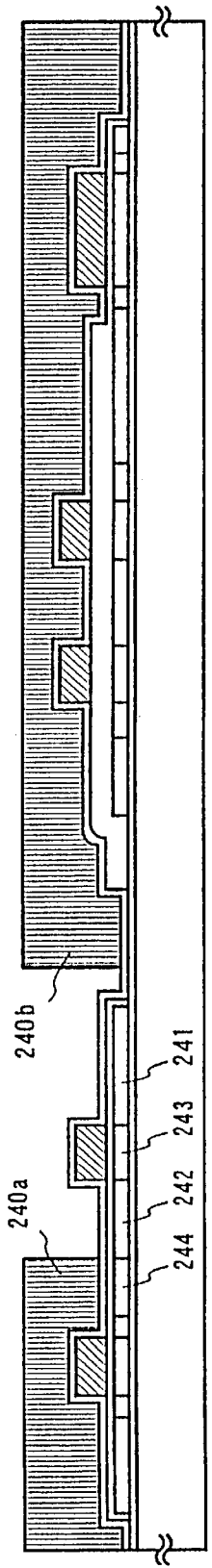
FIGS. 4A to 4C are views showing fabricating steps of the AM-LCD.

Next, portions except for the region which becomes the PTFT of the CMOS circuit are covered with resist masks 240a and 240b, and an adding step of an element in group 13 of the periodic table (in this embodiment, boron) is carried out. In this step, the addition is made at such a dose amount as to form an impurity region having a concentration higher than that of already added phosphorus. Specifically, adjustment is made so that boron is added in a concentration of $1 \times 10^{20}$ to $3 \times 10^{21}$ atoms/cm$^3$. In the present specification, the boron concentration at this time is expressed by (p++). As a result, the conductivity of all impurity regions exhibiting N-type conductivity and formed in the region which becomes the PTFT is inverted by boron, and the regions become impurity regions exhibiting P-type conductivity (FIG. 4A).

Of course, also in this step, an ion implantation method in which mass separation is carried out may be used, or a plasma doping method in which mass separation is not carried out may be used. With respect to conditions such as an acceleration voltage or dose amount, optimum values may be set by an operator.

By this step, a source region 241, a drain region 242, and a channel forming region 243 of the PTFT constituting the CMOS circuit are defined. Besides, a drain region 244 of the NTFT of the CMOS circuit is defined.

Figure 4B:
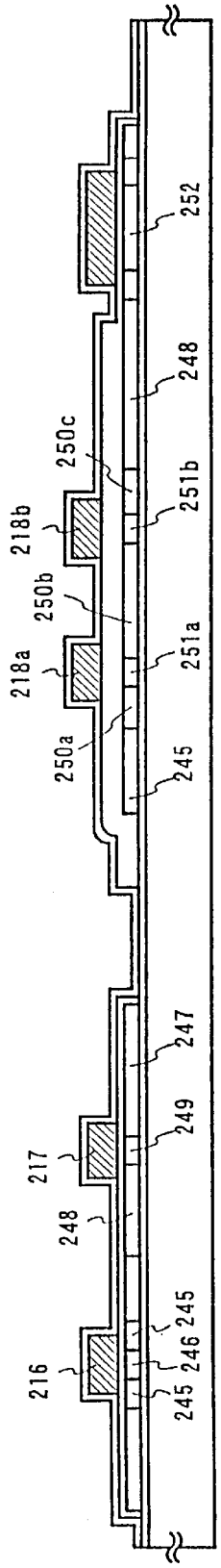

After all the impurity regions are formed in this way, the resist masks 240a and 240b are removed. Then, a heat treatment within the temperature range of 750 to 1150° C. for 20 minutes to 12 hours is carried out. In this embodiment, a heat treatment at 950° C. for 2 hours is carried out in an inert gas atmosphere (FIG. 4B).

In this step, phosphorus or boron added to the respective impurity regions is activated, and at the same time, the LDD region is extended toward the inside (in a direction toward the channel forming region) to realize such a structure that the LDD region and the gate wiring are three-dimensionally overlapped with each other.

That is, in an LDD region 245 of the CMOS circuit, phosphorus contained in the LDD region 245 is diffused toward a channel forming region 246. As a result, such a state is obtained that the LDD region 245 overlaps with the gate wiring 216 three-dimensionally. Such a structure is very effective in preventing deterioration due to injection of hot carriers.

Similarly, in the PTFT of the CMOS circuit, a source region 247 and a drain region 248 diffuse toward the direction of a channel forming region 249 and overlap with the gate wiring 217. In the pixel TFT, LDD regions 250a to 250c respectively diffuse toward the direction of channel forming regions 251a and 251b, and respectively overlap with the gate wirings 218a and 218b.

The diffusion distance of the impurity can be controlled by temperature and time of a heat treatment. Thus, it is possible to freely control the distance (length) of a portion where the LDD region (or the source region and drain region of the PTFT) overlaps with the gate wiring. In this embodiment, adjustment is made so that the overlap distance becomes 0.05 to 1 $\mu$m (preferably 0.1 to 0.3 $\mu$m).

By this step, a first capacitance electrode 252 is defined. If an impurity element to give a conductivity type is contained in the first capacitance electrode 252, it is activated at this point of time.

Incidentally, the protective film 220 formed on the gate wiring in this embodiment is provided to prevent the gate wiring from being oxidized in this thermal activation step. However, it is not always necessary to provide this protective film just after formation of the gate wiring. That is, even if the protective film is provided on the uppermost layer after formation of a first interlayer insulating film which is formed after this, and thereafter, the thermal activation step of the impurity element is carried out, the same effect can be obtained.

After the state of FIG. 4B is obtained in this way, a first interlayer insulating film 253 is formed. In this embodiment, a silicon oxide film having a thickness of 1 $\mu$m and formed by a plasma CVD method is used. Here, a hydrogenating treatment is carried out. This step is such a step that the whole substrate is exposed to hydrogen excited (activated) by plasma or heat. It is appropriate that the temperature of the hydrogenating treatment is set to 350 to 450° C. (preferably 380 to 420° C.) in the case where excitation is made by heat.

Figure 4C:
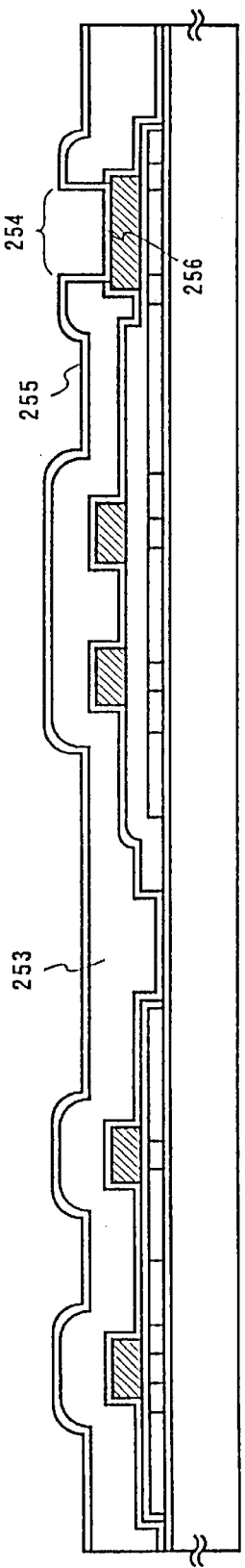

After the hydrogenating treatment is completed, the first interlayer insulating film 253 over the second capacitance electrode 219 is removed, and an opening portion 254 is formed so as to expose a part of the second capacitance electrode 219. Next, a silicon oxide film 255 having a thickness of 5 to 50 nm (preferably 10 to 30 nm) is formed on the exposed second capacitance electrode 219. A portion designated by 256 in the silicon oxide film 255 functions as a dielectric (second dielectric) of the upper storage capacitor. In this way, the state of FIG. 4C is obtained.

In this embodiment, the silicon oxide film 255 is formed by a low pressure thermal CVD method. It is desirable to form the silicon oxide film (dielectric) having high quality by using silane ($SiH_4$) and nitrous oxide ($N_2O$) as a film forming gas and by setting the film formation temperature to 800° C.

Next, light-shielding films 257a to 257c comprising titanium having a thickness of 100 nm are formed. At this time, especially the light-shielding film indicated by 257c functions as a third capacitance electrode. That is, the second storage capacitor is formed of the second capacitance electrode 219, the second dielectric 256, and the third capacitance electrode 257c.

In the case of this embodiment, although the light-shielding films 257a to 257c are shown in different patterns in the drawing, they have actually the same pattern. That is, only a portion where a contact hole for subsequent formation of a source wiring or drain wiring is to be formed is opened.

After the light-shielding films 257a to 257c are formed in this way, a passivation film 258 is formed. As the passivation film 258, a silicon nitride film, a silicon oxide nitride film, a silicon nitride oxide film, or a laminate film of the foregoing insulating film and a silicon oxide film may be used. In this embodiment, a silicon nitride film having a thickness of 300 nm is used as the passivation film.

In this embodiment, as a pretreatment to formation of the passivation film 258 comprising silicon nitride, a plasma treatment using an ammonia gas is carried out. Then, the passivation film 258 is formed directly. By this pretreatment, hydrogen activated (excited) by plasma is confined in the passivation film 258. Further, when a nitrous oxide gas is added in addition to the gas containing hydrogen, the surface of an object to be treated is cleaned by generated moisture, and especially contamination caused by boron or other contaminants present in the air can be effectively prevented.

After the passivation film 258 is formed in this way, a heat treatment step at about 400 to 420° C. is now carried out. A treatment atmosphere may be an inert gas atmosphere or an atmosphere containing hydrogen. In this step, hydrogen released from the passivation film 258 and a large amount of hydrogen contained in the first interlayer insulating film 253 due to the previous hydrogenating step diffuse downward (diffusion in the upper direction is blocked by the passivation film 258 as a blocking layer), so that the active layer is terminated with hydrogen. As a result, it becomes possible to effectively inactivate dangling bonds in the active layer.

After this hydrogenating treatment is ended, an acrylic film having a thickness of 1 $\mu$m is formed as a second interlayer insulating film 259. Then, after contact holes are formed, source wirings 260 and 261 and a drain wiring 262 of the CMOS circuit, and a source wiring 263 and a drain wiring 264 of the pixel TFT are formed. These wirings are respectively formed of a laminate film in which a conductive film containing aluminum as its main ingredient is sandwiched between titanium films (FIG. 5A).

Figure 5A:
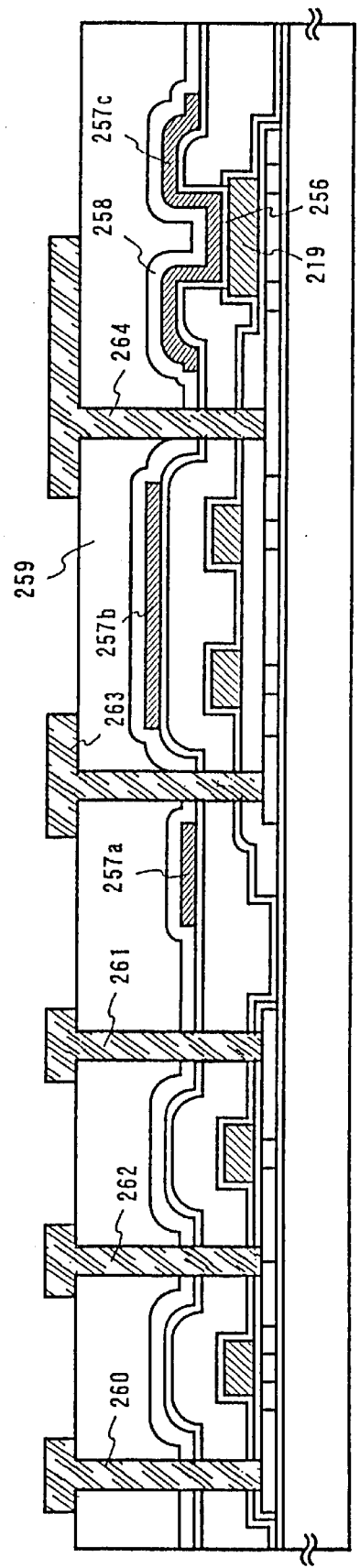
FIGS. 5A and 5B are views showing fabricating steps of the AM-LCD.

After the state of FIG. 5A is obtained in this way, next, an acrylic film having a thickness of 1 $\mu$m is again formed so that a third interlayer insulating film 265 is formed. Then, contact holes are formed at the same time over the light-shielding film 257b and the drain wiring 264 of the pixel TFT, and a pixel electrode 266 comprising a transparent conductive film (typically, an ITO film) is formed (FIG. 5B).

At this time, it is preferable that the connection between the light-shielding film 257 and the pixel electrode 266 is made above the pixel TFT. By doing so, it is possible to prevent the contact hole from affecting the opening ratio of the pixel region. Also, the drain wiring and the light-shielding film thus come to have the same potential through the pixel electrode 266.

Also, in this step, the depths of the contact holes formed over the light-shielding film 257b and the drain wiring 264 are different. However, since both the light-shielding film 257b and the drain wiring 264 have the surface comprising a titanium film, a sufficient selection ratio to the second and third interlayer insulating films comprising resin films can be obtained. Thus, with respect to the simultaneous formation of the contact holes, there is no problem.

Figure 5B:
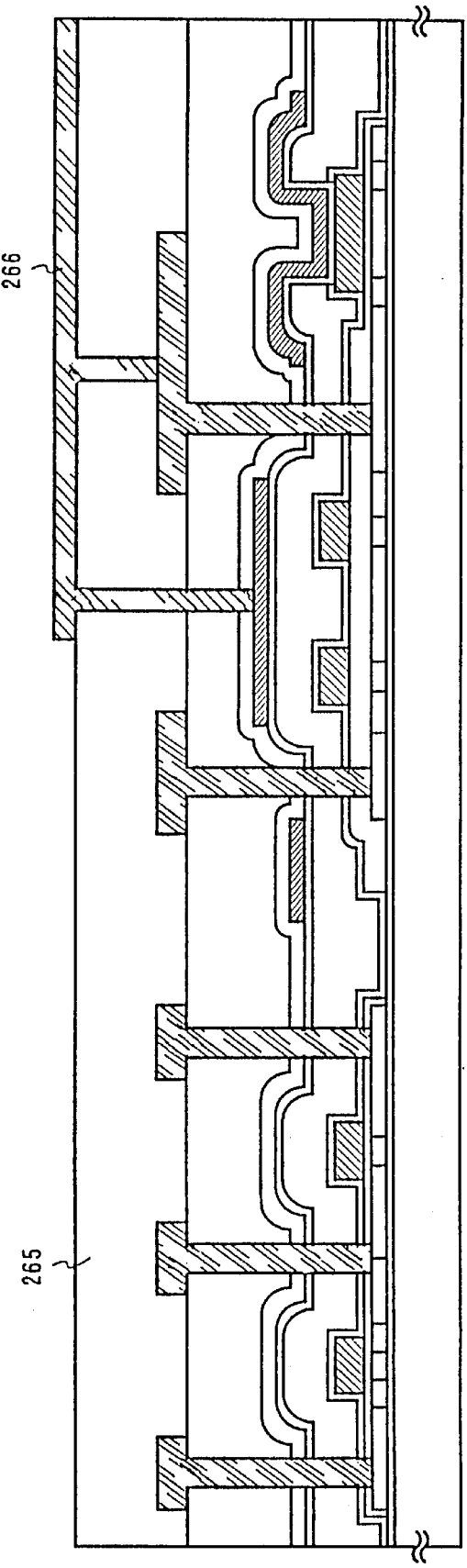

In this way, an AM-LCD having the structure as shown in FIG. 5B is completed. In the AM-LCD of the present invention, the thicknesses of the gate insulating films are different between the driver circuit (or signal processing circuit) and the pixel region formed on the same substrate. Typically, some of the driver TFTs (circuit required to perform a high speed operation) used for the driver circuit has a gate insulating film thinner than that of the pixel TFT.

Moreover, the present invention is also characterized in that the gate insulating film of a circuit required to perform a high speed operation and the dielectric (first dielectric) of the first storage capacitor provided in the pixel region are formed at the same time, and have the same thickness. That is, the present invention has a feature that a step of forming the thin gate insulating film of the circuit required to perform a high speed operation is also used as a step of thinning the first dielectric.

Moreover, the present invention has a feature that the light-shielding film which is conventionally formed on the source wiring or drain wiring is formed under the source wiring or drain wiring, and the pixel electrode and the light-shielding film are made to have the same potential, so that the light-shielding film is used as the electrode (in this embodiment, third capacitance electrode) of the storage capacitor (second storage capacitor).

That is, it is possible to realize the AM-LCD having such a structure that the first storage capacitor and the second storage capacitor are formed to overlap with each other (from the viewpoint of a circuit, they are connected in parallel with each other). By such a structure, it becomes possible to increase the capacity of the whole storage capacitor without widening the area.

When the fabricating steps of this embodiment are employed, an active layer (semiconductor film) of a final TFT comprises a crystalline silicon film with a unique crystal structure having continuity at crystal lattices. The features will be described below.

As a first feature, the crystalline silicon film formed in accordance with the fabricating steps of this embodiment microscopically has a crystal structure in which a plurality of needle-like or rod-like crystals (hereinafter abbreviated to "rod-like crystal") are collected and arranged. This is easily ascertained by observation with a TEM (Transmission Electron Microscopy).

As a second feature, when electron beam diffraction is used, it is possible to ascertain that the surface (portion where a channel is formed) of the crystalline silicon film formed in accordance with the fabricating steps of this embodiment has a main oriented plane of {110} plane although some deviation is included in crystal axes. This is ascertained from the fact that when an electron beam diffraction photograph with a spot diameter of about 1.35 μm is observed, diffraction spots having regularity peculiar to the {110} plane appear. Besides, it is also ascertained that the spots are distributed on concentric circles.

In the electron beam diffraction, although diffraction spots having regularity peculiar to the {110} plane is ascertained, strictly speaking, it can be said that a plane orientation contained in the <111> crystal zone is dominant. That is, under the present circumstances, although the {110} plane stable in energy seems to surpass, by controlling the orientation, it is also possible for the main oriented plane to have a plane orientation selected from the {211} plane, {321} plane, {431} plane, {532} plane, and {541} plane. Also in such a case, the property of the crystalline silicon film explained here is not changed.

As a fourth feature, when an orientation ratio is calculated by using an X-ray diffraction method (strictly speaking, an X-ray diffraction method using a θ–2θ method), it is ascertained that the orientation ratio of {220} plane is 0.7 or more (typically 0.85 or more). As a method of calculating the orientation ratio, a method disclosed in Japanese Patent Application Laid-open is used.

As a fifth feature, the present applicant observes crystal grain boundaries formed through contact of the respective rod-like crystals by using an HR-TEM (High Resolution Transmission Electron Microscopy), and it has been ascertained that crystal lattices have continuity at the crystal grain boundaries. This can be easily ascertained from the fact that the observed lattice stripes are continuously connected at the crystal grain boundaries.

The continuity of the crystal lattice at the crystal grain boundary is caused from the fact that the crystal grain boundary is a grain boundary called "planar boundary". The definition of the planar boundary in the present specification agrees with "Planar boundary" disclosed in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751–758, 1988".

According to the above paper, the planar boundary includes a twin boundary, a specific laminate defect, a specific twist boundary, and the like. This planar boundary has a feature that it is electrically inactive. That is, since the planar boundary does not function as a trap to block the movement of a carrier though it is a crystal grain boundary, it can be regarded as not substantially existing.

Particularly in the case where a crystal axis (axis normal to a crystal plane) is a <110> axis, a {211} twin boundary is also called a coincidence boundary of Σ3. The Σ value is a parameter which is an index showing the degree of conformity of the coincidence boundary, and it is known that as the value becomes smaller, the conformity of the grain boundary becomes more excellent. For example, in the crystal grain boundary formed between two crystal grains, and in the case where both crystals have a plane orientation of {110}, when an angle formed by lattice stripes corresponding to a {111} plane is θ, it is known that when θ=70.50, the boundary becomes a coincidence boundary of Σ3.

In the crystalline silicon film obtained by carrying out this embodiment, when crystal grain boundaries formed between two crystal grains each having a crystal axis of {110} is observed by the HR-TEM, there are many crystal grain boundaries at which the respective lattice stripes of adjacent crystal grains are continuous at about 70.5°. Thus, it is presumed that the crystal grain boundary is a coincidence boundary of Σ3, is that is, the {211} twin boundary.

Such a crystal structure (correctly, structure of a crystal grain boundary) shows that two different crystal grains are connected to each other with extremely superior conformity at the crystal grain boundary. That is, such a structure is formed that crystal lattices are continuously connected at the crystal grain boundary and it is very hard to form a trap level due to a crystal defect etc. Thus, a semiconductor thin film with such a crystal structure can be regarded as having substantially no crystal grain boundary.

Besides, it is ascertained by TEM observation that almost all of defects existing in crystal grains disappear in a heat treatment step (corresponding to the thermal oxidation step in this embodiment) at a high temperature of 700 to 1150° C. This is obvious also from the fact that the number of defects is greatly decreased after this heat treatment step as compared with the number before the step.

The difference in the number of defects appears as difference in spin density by electron spin resonance (ESR). In the present circumstances, it is found that the spin density of the crystalline silicon film fabricated in accordance with the fabricating steps of this embodiment is $5 \times 10^{17}$ spins/cm$^3$ or less (preferably $3 \times 10^{17}$ spins/cm$^3$ or less). However, since this measured value approximates the detection limit of existing measuring apparatuses, it is expected that an actual spin density is further low.

From the above, since the crystalline silicon film obtained by carrying out this embodiment does not substantially include crystal grains and crystal grain boundaries, the film can be regarded as a single crystal silicon film or substantially a single crystal silicon film.

(Findings as to Electrical Characteristics of a TFT)

A TFT (having the same structure as the CMOS circuit shown in FIG. 5A) fabricated in this embodiment exhibits electrical characteristics comparable to a MOSFET. Data as shown below has been obtained from a TFT (thickness of an active layer is 35 nm, thickness of a gate insulating film is 80 nm) experimentally formed by the present applicant.

(1) The subthreshold coefficient as an index showing switching performance (promptness in switching of on/off operation) is as small as 80 to 150 mV/decade (typically 100 to 120 mV/decade) for both an N-channel TFT and a P-channel TFT.

(2) The field effect mobility ($\mu_{FE}$) as an index showing an operation speed of a TFT is as large as 150 to 650 cm$^2$/Vs (typically 200 to 500 cm$^2$/Vs) for an N-channel TFT, and 100 to 300 cm$^2$/Vs (typically 120 to 200 cm$^2$/Vs) for a P-channel TFT.

(3) The threshold voltage (Vth) as an index of a driving voltage of a TFT is as small as –0.5 to 1.5 V for an N-channel TFT and –1.5 to 0.5 V for a P-channel TFT.

As described above, it has been ascertained that extremely superior switching characteristics and high speed operation characteristics can be realized.

[Embodiment 2]

In this embodiment, that a TFT of what structure is arranged in what circuit will be described with reference to FIG. 7 and FIGS. 8A to 8C.

In an AM-LCD, a minimum operating voltage (power source voltage) is different for each circuit. For example, in a pixel region, in view of a voltage applied to a liquid crystal and a voltage for driving a pixel TFT, the operating voltage becomes as high as 14 to 20 V. Thus, it is necessary to use such a TFT as to withstand application of such a high voltage.

With respect to a shift register circuit or the like used for a source driver circuit or a gate driver circuit, an operating voltage of about 5 to 10 V is sufficient. As the operating voltage becomes low, compatibility with an external signal comes to be secured, and further, there is an advantage that consumed electric power can be suppressed. However, while the foregoing high withstand voltage TFT has the superior withstand voltage property, the operation speed is sacrificed. Thus, it is unsuitable for a circuit which is required to perform a high speed operation, such as a shift register circuit.

Like this, circuits formed on a substrate are classified by their objects into a circuit required to perform a TFT in which importance is attached to the withstand voltage characteristic and a circuit requiring a TFT in which importance is attached to the operation speed.

Figure 7:
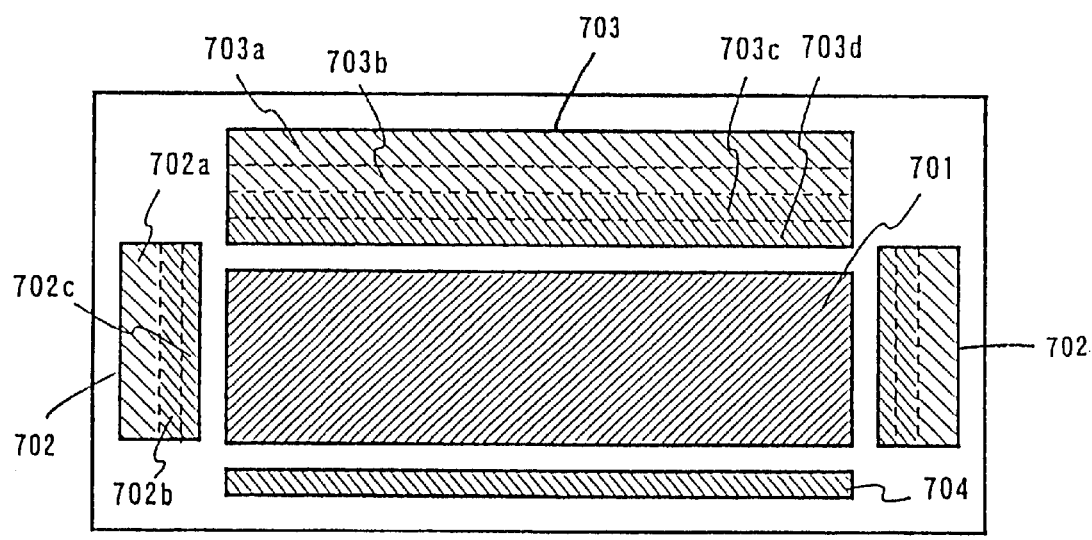
FIG. 7 is a view showing a block diagram of an AM-LCD.

Here, the structure of this embodiment is specifically shown in FIG. 7. FIG. 7 is a top view of a block diagram of an AM-LCD. Reference numeral 701 designates a pixel region which includes a pixel TFT and a storage capacitor at each pixel, and functions as a display portion. Reference numeral 702a designates a shift register circuit; 702b, a level shifter circuit; and 702c, a buffer circuit. These circuits altogether form a gate driver circuit 702.

In the AM-LCD shown in FIG. 7, gate driver circuits 702 are provided on both sides of the pixel region, and have the same gate wiring in common. That is, such redundancy is given that even if a trouble occurs in either one of the gate drivers, a voltage can be applied to the gate wiring.

Reference numeral 703a designates a shift register circuit; 703b, a level shifter circuit; 703c, a buffer circuit; and 703d, a sampling circuit. These circuits altogether form a source driver circuit 703. A precharge circuit 704 is provided on the opposite side of the source driver circuit with the pixel region interposed therebetween.

In the AM-LCD having such a structure, the shift register circuits 702a and 703a are circuits required to perform a high speed operation, in which an operation voltage is as low as 3.3 to 10 V (typically 3.3 to 5 V) and a high withstand voltage characteristic is not particularly required. Thus, it is appropriate that the thickness of the gate insulating film is made as thin as 5 to 50 nm (preferably 10 to 30 nm).

Figure 8A:
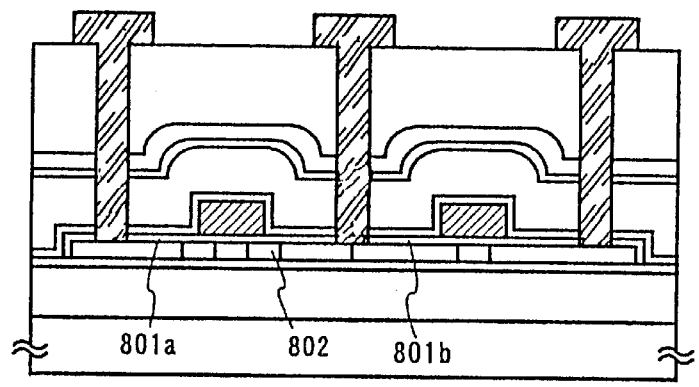
FIGS. 8A to 8C are views showing circuit arrangements of an AM-LCD.

FIG. 8A is a schematic view of a CMOS circuit to be used for a circuit required to perform a high speed operation, such as a shift register circuit or other signal processing circuits. In FIG. 8A, reference numeral 801a designates a gate insulating film of an NTFT, and 801b designates a gate insulating film of a PTFT. The film thickness is designed to be as thin as 5 to 50 nm (preferably 10 to 30 nm).

It is preferable that the length of an LDD region 802 is 0.1 to 0.5 μm (typically 0.2 to 0.3 μm). It is also possible not to provide the LDD region if the operation voltage is as sufficiently low as 2 to 3 V.

Figure 8B:
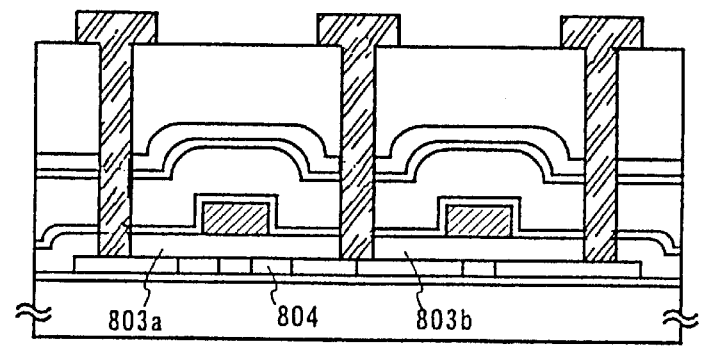

Next, a CMOS circuit shown in FIG. 8B is suitable mostly for the level shifter circuits 702b and 703b, the buffer circuits 702c and 703c, the sampling circuits 703d, and the precharge circuit 704. Since it is necessary to make a large current flow through these circuits, the operation voltage is as high as 14 to 16 V. Especially on the gate driver side, there is also a case where an operation voltage of 19 V is required. Thus, it is necessary to use a TFT having a very excellent withstand voltage characteristic (high withstand voltage characteristic).

At this time, in the CMOS circuit shown in FIG. 8B, the thickness of a gate insulating film 803a of an NTFT and that of a gate insulating film 803b of a PTFT are respectively designed to be 50 to 200 nm (preferably 100 to 150 nm). In the circuits required to have such a high withstand voltage characteristic, it is preferable that the thickness of the gate insulating film is made thicker than that of the TFT of the shift register circuit or the like shown in FIG. 8A.

It is preferable that the length of an LDD region 804 is 1 to 3 μm (typically 1.5 to 2 μm). Incidentally, it is appropriate that the length of a portion of the LDD region overlapping with a gate wiring is 0.5 to 2 μm (preferably 1 to 1.5 μm). In the CMOS circuit shown in FIG. 8B, since a high voltage comparable to the voltage applied to the pixel, as in a buffer circuit, is applied, it is desirable that the length of the LDD region is also made comparable to or close to the pixel.

Figure 8C:
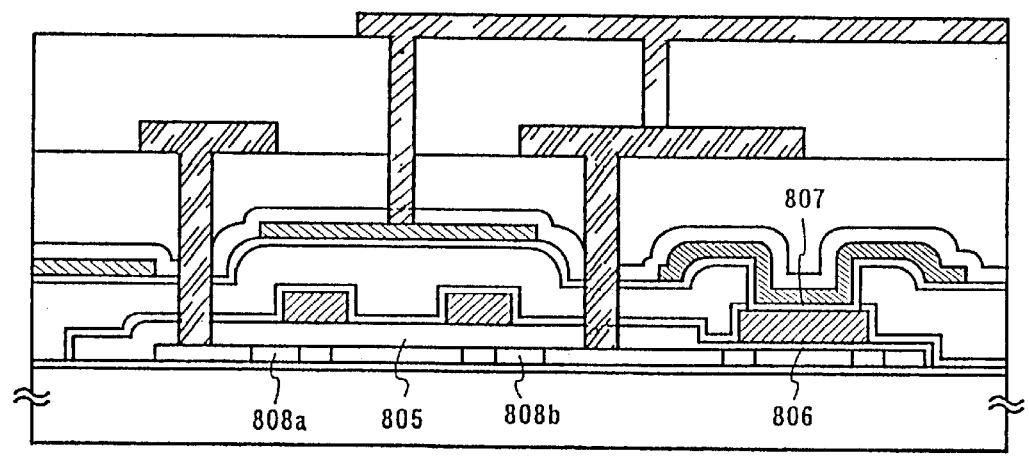

Next, FIG. 8C is a schematic view of the pixel region 701. Since a voltage applied to a liquid crystal is also added, the pixel TFT is required to have an operating voltage of 14 to 16 V. Also, since an electric charge stored in the liquid crystal and the storage capacitor must be held for a period of one frame, an off-current must be as small as possible.

From such reasons, in this embodiment, a double gate structure using an NTFT is adopted, and the thickness of a gate insulating film 805 is set to 50 to 200 nm (preferably 100 to 150 nm). This thickness may be the same as or different from the CMOS circuit shown in FIG. 8B.

It is appropriate that the film thickness of a first dielectric 806 of a first storage capacitor and that of a second dielectric 807 of a second storage capacitor are respectively set to 5 to 75 nm (preferably 20 to 50 nm).

Also, it is preferable that the lengths of LDD regions 808a and 808b are respectively 2 to 4 μm (typically 2.5 to 3.5 μm). Incidentally, the length of a portion of the LDD region overlapping with a gate wiring may be 0.5 to 2.5 μm (preferably 1 to 1.5 μm).

Also, since it is necessary to decrease an off-current (drain current flowing when a TFT is in an off state) of the pixel TFT shown in FIG. 8C to the utmost, it is desirable that the length of a region (region functioning as a normal LDD region) of the LDD regions 808a and 808b not overlapping with the gate wiring is set to 1 to 3.5 μm (preferably 2 to 3 μm).

As described above, even when the AM-LCD is used as an example, various circuits are provided on the same substrate and there is a case where necessary operating voltages (power source voltages) are different among the circuits. In this case, it becomes necessary to make such contrivance that TFTs including gate insulating films having different thicknesses are arranged as in the present invention.

Incidentally, it is effective to use the circuit shown in the embodiment 1 in order to realize the structure of this embodiment.

[Embodiment 3]

Figure 9:
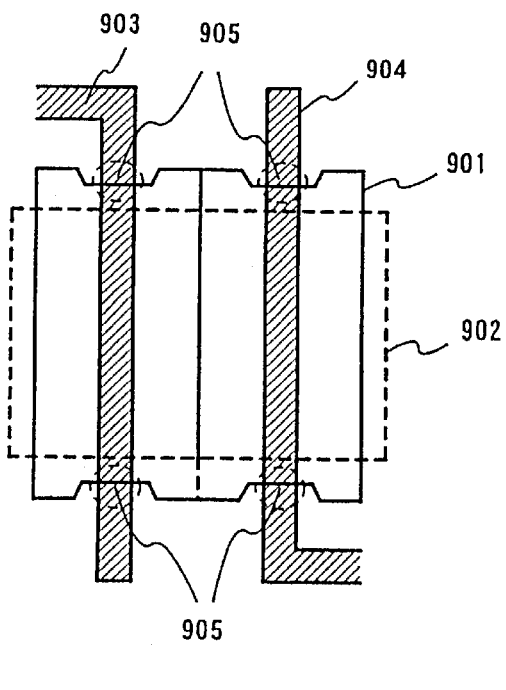
FIG. 9 is a view showing the structure of a driver TFT (CMOS circuit).

In the embodiment 1, at the step of selectively removing the gate insulating film, it is desirable to carry out the removal in the region which becomes the driver TFT as shown in FIG. 9. In FIG. 9, reference numeral 901 designates an active layer; 902, an end portion of a gate insulating film; and 903 and 904, gate wirings. As shown in FIG. 9, it is desirable that the gate insulating film is made to remain at the end portion of the active layer 901 in a portion 905 where the gate wiring gets over the active layer.

At the end portion of the active layer 901, a phenomenon called edge thinning occurs when a thermal oxidation step is later carried out. This is such a phenomenon that an oxidation reaction proceeds as if it crawls under the end portion of the active layer, so that the end portion becomes thin and at the same time, it swells upward. Thus, when the edge thinning phenomenon occurs, there occurs a problem that the gate wiring is apt to be broken at the time of overstriding.

However, if the gate insulating film is removed so that the structure as shown in FIG. 9 is obtained, it is possible to prevent the edge thinning phenomenon at the portion 905 where the gate wiring gets over the active layer. Thus, it is possible to prevent problems such as disconnection of the gate wiring from occurring. Incidentally, it is effective to use the structure of this embodiment for the embodiment 1.

[Embodiment 4]

In this embodiment, a description will be made on a case where TFTs are formed on a substrate by the fabricating steps described in the embodiment 1 and an AM-LCD is actually fabricated.

After the state of FIG. 5B is obtained, an orientation film having a thickness of 80 nm is formed on the pixel electrode 266. Next, an opposite substrate in which a color filter, a transparent electrode (opposite electrode), and an orientation film are formed on a glass substrate is prepared. A rubbing treatment is carried out to the respective orientation films, and the substrate on which the TFTs are formed is bonded to the opposite substrate by using a seal material (sealing material). Then, a liquid crystal is held therebetween. Since well-known means may be used for this cell assembling step, its detailed description is omitted.

A spacer for maintaining a cell gap may be provided as the need arises. Thus, in the case where the cell gap can be maintained without the spacer as in the AM-LCD having a size of 1 inch in diagonal, it is not necessary to particularly provide the spacer.

Figure 10:
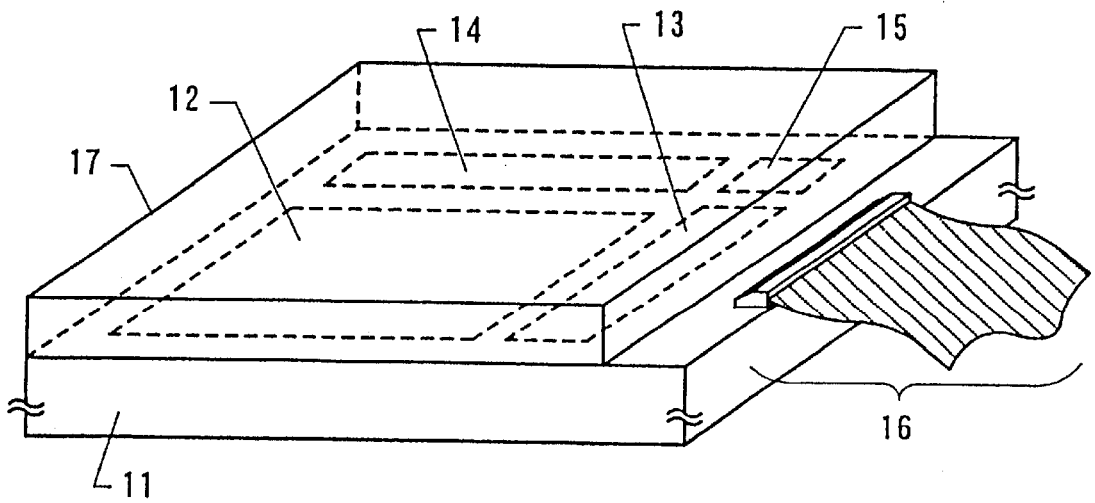
FIG. 10 is a view showing an outer appearance of an AM-LCD.

Next, FIG. 10 shows an outer appearance of an AM-LCD fabricated in the manner as described above. A pixel region 12, a source driver circuit 13, a gate driver circuit 14, and a signal processing circuit (signal dividing circuit, D/A converter circuit, γ-correction circuit, differential amplification circuit, etc.) 15 are formed on an active matrix substrate (indicating a substrate on which TFTs are formed) 11. An FPC (flexible printed circuit) 16 is attached to the substrate. The opposite substrate is denoted by 17.

Incidentally, this embodiment can be freely combined with any of the embodiments 1 to 3.

[Embodiment 5]

In this embodiment, a description will be made on a case where another means is used for formation of a crystalline silicon film in the embodiment 1.

Specifically, a technique disclosed in embodiment 2 of Japanese Patent Application Laid-open No. Hei 7-130652 (corresponding to U.S. patent application Ser. No. 08/329,644) is used for crystallization of an amorphous silicon film. The technique disclosed in the publication is such a technique that a catalytic element (typically nickel) for promoting crystallization is selectively held on a portion of a surface of an amorphous silicon film, and crystallization is carried out with the portion as a seed of nuclear growth.

According to this technique, since specified directionality can be given to crystal growth, it is possible to form a crystalline silicon film having extremely high crystallinity.

It is also possible to use without any modification a masking insulating film provided to selectively hold the catalytic element as a mask to phosphorus added for gettering. By doing so, the number of steps can be reduced. This technique is disclosed in detail in Japanese Patent Application Laid-open No. Hei 10-247735 (corresponding to U.S. patent application Ser. No. 09/034,041) filed by the present applicant.

Incidentally, the structure of this embodiment can be freely combined with any of the embodiments 1 to 4.

[Embodiment 6]

In the embodiment 1, phosphorus is used for gettering of nickel (catalytic element used for crystallization of a silicon film). In this embodiment, a description will be made on a case where nickel is gettered by using another element.

First, in accordance with the steps of the embodiment 1, the state of FIG. 2B is obtained. In FIG. 2B, reference numeral 204 designates a crystalline silicon film. However, in this embodiment, the concentration of nickel used for crystallization is made as small as possible. Specifically, a layer containing nickel of 0.5 to 3 ppm in terms of weight is formed on an amorphous silicon film, and a heat treatment for crystallization is carried out. The concentration of nickel contained in the crystalline silicon film formed by this becomes $1\times10^{17}$ to $1\times10^{19}$ atoms/cm$^3$ (typically $5\times10^{17}$ to $1\times10^{18}$ atoms/cm$^3$).

After the crystalline silicon film is formed, a heat treatment is carried out in an oxidizing atmosphere containing a halogen element. The temperature is set to 800 to 1150° C. (preferably 900 to 1000° C.), and the processing time is made 10 minutes to 4 hours (preferably 30 minutes to 1 hour).

In this embodiment, a heat treatment at 950° C. for 30 minutes is carried out in an atmosphere containing hydrogen chloride of 3 to 10 vol % to an oxygen atmosphere By this step, nickel in the crystalline silicon film becomes volatile nickel chloride and escapes to the treatment atmosphere. That is, it becomes possible to remove nickel by the gettering action of the halogen element. However, if the concentration of nickel existing in the crystalline silicon film is too high, there occurs a problem that oxidation abnormally proceeds in the segregated portion of nickel. Thus, it is necessary to lower the concentration of nickel used at the stage of crystallization to the utmost.

Incidentally, the structure of this embodiment can be freely combined with any of the embodiments 1 to 5.

[Embodiment 7]

In this embodiment, a description will be made on a case where the structure of the CMOS circuit and the pixel region shown in the embodiment 1 is made different. Specifically, an example in which the arrangement of LDD regions is made different in accordance with specifications required for circuits, will be described.

Since the basic structure of a CMOS circuit and a pixel region has been already shown in FIG. 1, in this embodiment, a description will be made while reference numerals are given to only necessary portions. With respect to a TFT structure of this embodiment, although the fabricating steps of the embodiment 1 may be basically referred to, it is necessary to use a resist mask for formation of an LDD region of an NTFT.

Figure 11A:
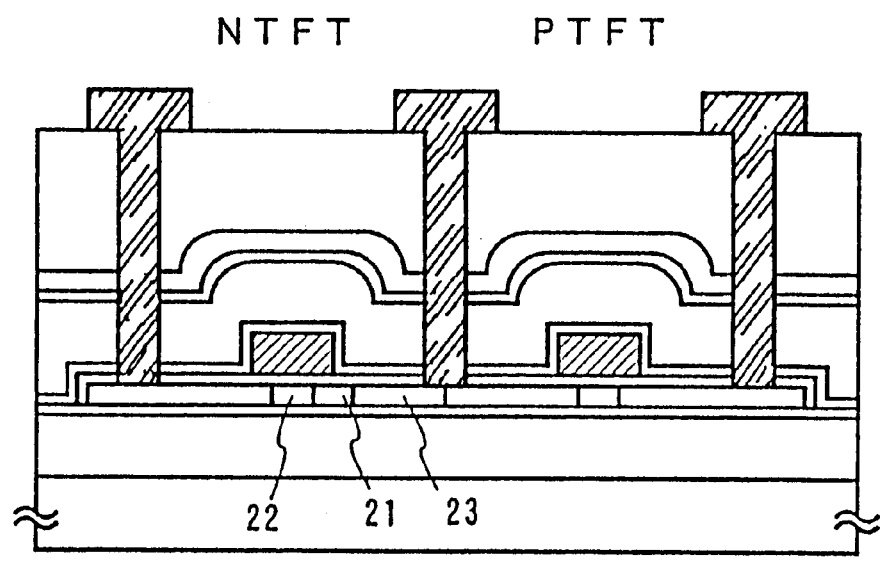
FIGS. 11A and 11B are views respectively showing a sectional structure of a CMOS circuit.

First, a circuit shown in FIG. 11A is characterized in that in the CMOS circuit, an LDD region 21 of the NTFT is provided to be in contact with a channel forming region 22 at only a side of a drain region 23. This structure can be realized by concealing a source region side with a resist mask.

Since a CMOS circuit used for a driver circuit or a signal processing circuit is required to perform a high speed operation, it is necessary to remove resistance components, which can be a factor to lower the operation speed, to the utmost. However, since the LDD region necessary for raising hot carrier resistance functions as a resistance component, the operation speed is sacrificed.

However, it is an end portion of a channel forming region on a drain region side that hot carrier injection occurs, and if an LDD region overlapping with a gate electrode three-dimensionally exists on the end portion, it is enough to handle hot carrier. Thus, it is not always necessary to provide an LDD region at the source region side end portion of the channel forming region beyond necessity.

Incidentally, the structure of FIG. 11A can not be applied to a case of performing an operation such as an operation of a pixel TFT in which a source region and a drain region are exchanged. In the case of the CMOS circuit, since the source region and the drain region are normally fixed, the structure as shown in FIG. 11A can be realized.

Figure 11B:
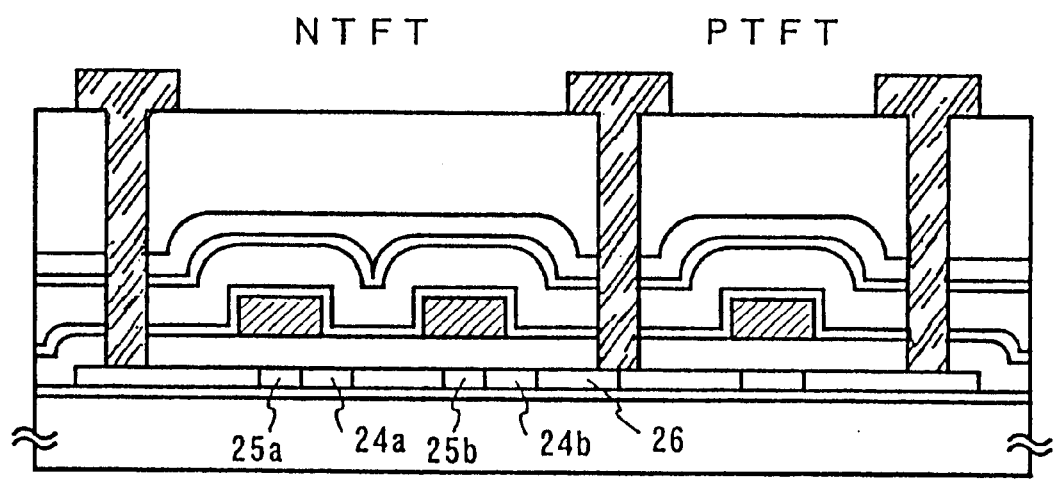

Next, a circuit shown in FIG. 11B is an example in which in a CMOS circuit, an NTFT has a double gate structure and a PTFT has a single gate structure. Such a structure is used for a driver circuit (buffer circuit, sampling circuit, etc.) which is required to have high withstand voltage.

This case is characterized in that LDD regions 24a and 24b of the NTFT are respectively provided on only a drain region 26 side (or a side near the drain region 26) of each of channel forming regions 25a and 25b.

By making such a structure, a resistance component due to an LDD region on a source region side is eliminated, and by making the double gate structure, there is an effect that an electric field applied between the source and the drain is dispersed and is relieved.

Incidentally, the structure of this embodiment can be freely combined with any of the embodiments 1 to 6.

[Embodiment 8]

In the embodiment 1, it is effective in suppressing a leak current due to photo excitation that a light-shielding film is provided under a TFT (specifically, under an active layer) as the need arises. Particularly, it is effective to provide the light-shielding film under the pixel TFT required to suppress the leak current (or off-current) to the utmost.

As the light-shielding film, a metal film, a black resin film, or the like may be used. In the case where the metal film is used, it is also possible to form another storage capacitor between the light-shielding film and the active layer by using the metal film. By doing so, such a structure is realized that three storage capacitors are connected to one pixel TFT.

Incidentally, the structure of this embodiment can be freely combined with any of the embodiments 1 to 7.

[Embodiment 9]

In this embodiment, a structure of a pixel region formed by using the present invention will be described with reference to FIGS. 12 to 17. Incidentally, the description of the FIGS. 1 to 5 may be referred to for the basic sectional structure thereof.

Figure 12:
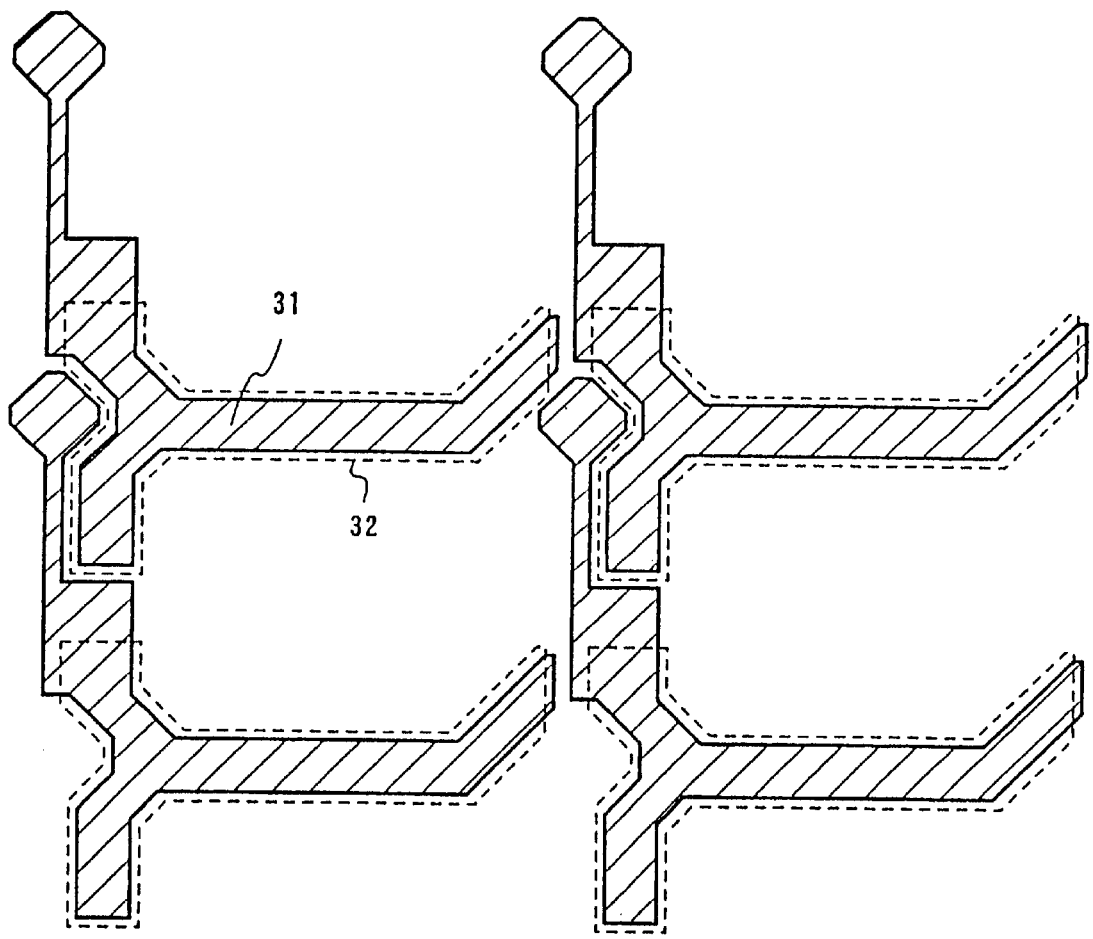
FIG. 12 is a view showing an upper surface structure of a pixel region.

First, in FIG. 12, reference numeral 31 designates an active layer of a pixel TFT comprising a semiconductor film. In the drawing, four active layers equivalent to four pixels are arranged. A dotted line designated by reference numeral 32 is an end portion of a gate insulating film of the pixel TFT. The gate insulating film of the region surrounded by this dotted line 32 is selectively removed. This state is a state where steps up to the state shown in FIG. 3A are completed.

Figure 13:
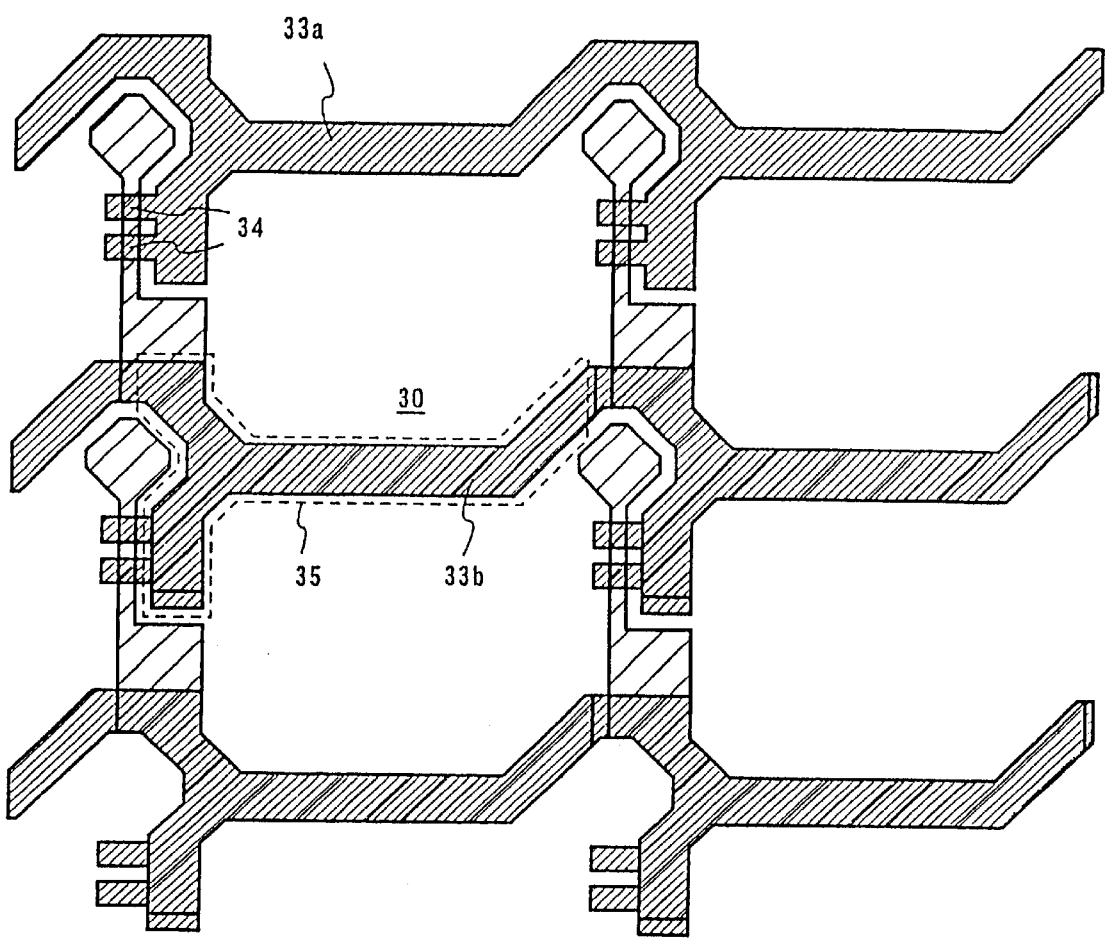
FIG. 13 is a view showing an upper surface structure of a pixel region.

Next, FIG. 13 shows a state where gate wirings 33a and 33b are overlapped with the TFT in the state of FIG. 12. This state corresponds to a state where steps up to the state of FIG. 3B are completed. A portion 34 overlapping with the active layer 31 functions as a gate electrode.

In this embodiment, the gate wiring 33b adjacent to the selected gate wiring 33a is used for a storage capacitor. This structure itself is known, and is such a structure that the gate wiring except for the selected gate wiring is made to have a decreased common potential (intermediate potential of a video signal), so that it is used as the wiring for formation of capacitance.

Here, paying attention to the gate wiring 33b, the gate wiring 33b overlaps with the active layer 31 in the region surrounded by a dotted line 35. Although not shown in the drawing, in the region surrounded by the dotted line 35, the gate insulating film is removed and a first dielectric having a thickness of 5 to 50 nm is provided. That is, in this portion, the first storage capacitor of the present invention is formed. The first storage capacitor formed in the region surrounded by the dotted line 35 functions as the storage capacitor of the pixel 30.

The merit of this structure is that since it is not necessary to additionally form a wiring for formation of capacitance, an opening ratio of a pixel can be raised. However, this structure is especially effective for a direct viewing type liquid crystal display or the like, and is unsuitable for a liquid crystal display in which up-and-down inversion driving (a driving method in which scanning is carried out from above and from below and which is used for a projector or the like) is carried out. In a liquid crystal display for carrying out such up-and-down inversion driving, it is desirable to use a driving method of an interlace system (a driving method of selecting every other gate wiring) or the like.

Figure 14:
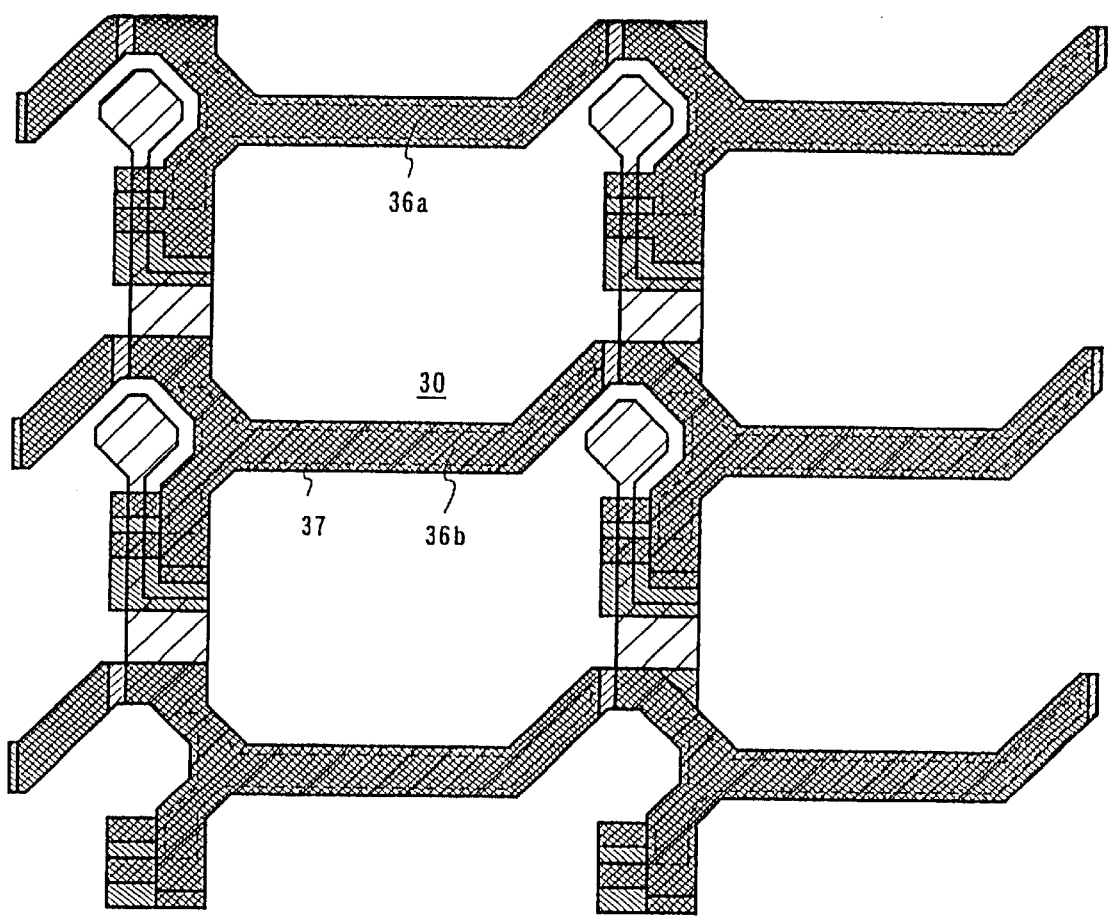
FIG. 14 is a view showing an upper surface structure of a pixel region.

Next, FIG. 14 shows a state where light-shielding films 36a and 36b are overlapped with the TFT in the state of FIG. 13. This state corresponds to the state in FIG. 5A at the point of time when the light-shielding films 257a to 257c are formed. In the case of adopting the structure of this embodiment, the light-shielding films are provided at such a rate that one film is provided on one pixel, and does not serve as a conductive film common to all pixels like a normal light-shielding film (called a black matrix or the like).

At this time, in FIG. 14, a first interlayer insulating film (not shown) is provided between the gate wiring and the light-shielding film, and a region surrounded by a dotted line designated by 37 is selectively removed, so that only a second dielectric having a thickness of 5 to 50 nm exists.

Since the light-shielding films 36a and 36b are basically provided so as to overlap with the gate wirings, the second storage capacitor of the present invention is formed in the region surrounded by the dotted line 37. However, in FIG. 14, the second storage capacitor formed in the region surrounded by the dotted line 37 functions as the storage capacitor of the pixel 30. That is, the light-shielding film 36a functions as a light-shielding film to conceal the pixel TFT portion of the pixel 30, and the light-shielding film 36b is a light-shielding film and at the same time, also functions as a third capacitance electrode for forming the storage capacitor of the pixel 30.

Figure 15:
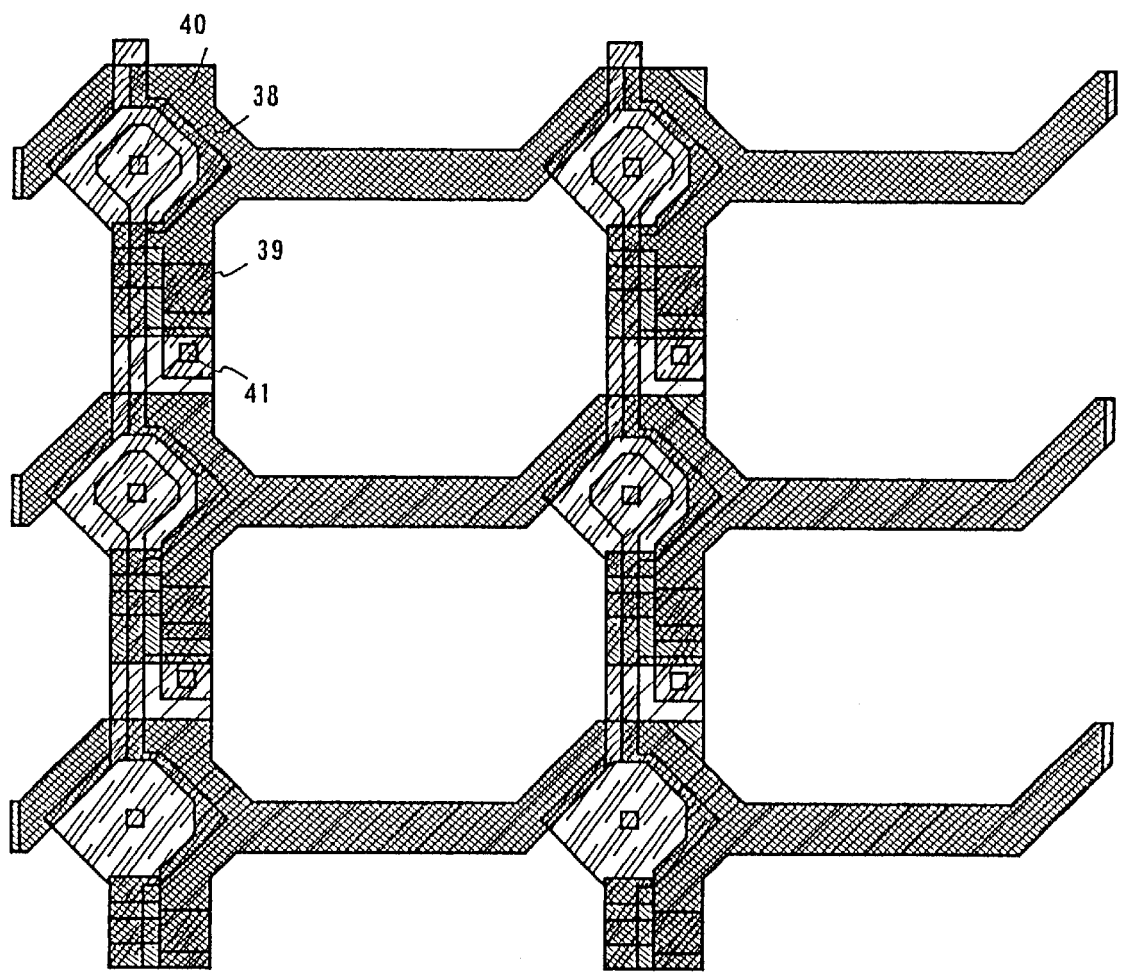
FIG. 15 is a view showing an upper surface structure of a pixel region.

Next, FIG. 15 shows a state where a source wiring 38 and a drain wiring (drain electrode) 39 are overlapped with the TFT in the state of FIG. 14. This state corresponds to the state where the step of FIG. 5A is completed. Reference numeral 40 designates a contact portion between the source wiring 38 and the active layer 31, and 41 designates a contact portion between the drain wiring 39 and the active layer 31.

Figure 16:
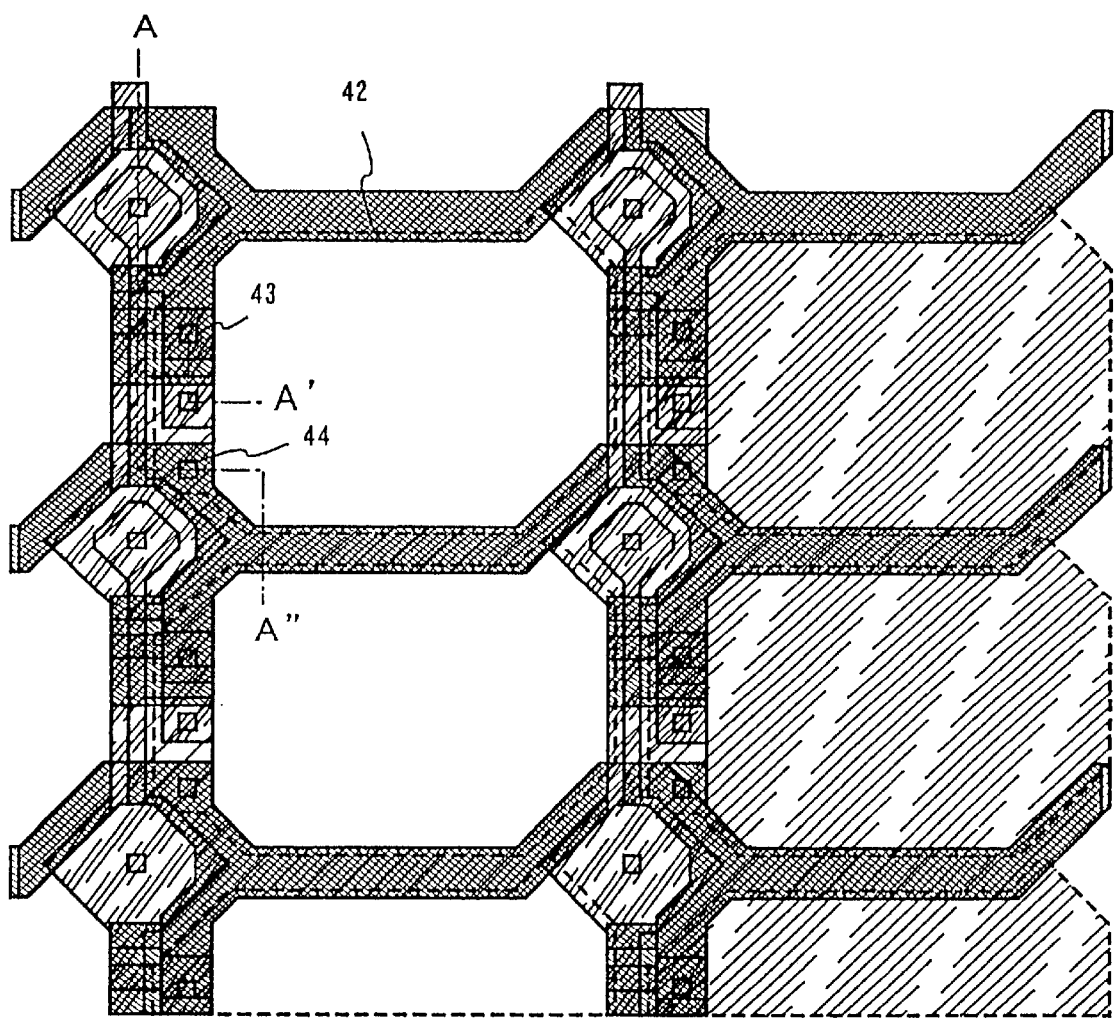
FIG. 16 is a view showing an upper surface structure of a pixel region.

Next, FIG. 16 shows a state where a pixel electrode 42 (indicated by a dotted line) is overlapped with the TFT in the state of FIG. 15. This state corresponds to the state where the step of FIG. 5B is completed. Incidentally, reference numeral 43 designates a contact portion between the drain wiring 39 and the pixel electrode 42, and reference numeral 44 designates a contact portion between the light-shielding film 36 and the pixel electrode 42.

Here, a section cut along the line A–A' of FIG. 16 is shown in FIG. 17A, and a section cut along the line A–A" is shown in FIG. 17B. In FIGS. 17A and 17B, reference numerals used in FIGS. 12 to 16 are used for the corresponding portions. Although reference numerals are not given to a substrate, a base film, a protective film, an interlayer insulating film, a passivation film, a structure (source region, drain region, LDD region, or channel forming region) of an active layer, and the like, they correspond to those of the mode for carrying out the present invention (see FIG. 1) or the embodiment 1 (see FIGS. 2A to 5B), their description is omitted here.

Incidentally, the structure of this embodiment can be freely combined with any structure of the embodiments 1 to 8.

[Embodiment 10]

In this embodiment, a description will be made on an example in which the order of adding steps of an impurity element for forming a source region, a drain region, or an LDD region of a pixel TFT is made different from the embodiment 1.

First, the adding step (n+ region forming step) of phosphorus shown in FIG. 3C may be replaced by the adding step (n– region forming step) of phosphorus shown in FIG. 3D.

Also, the adding step (p++ region forming step) of boron shown in FIG. 4A may be carried out prior to (between FIG. 3B and FIG. 3C) the adding step (n+ region is forming step) of phosphorous shown in FIG. 3C.

Also, the adding step (p++ region forming step) of boron shown in FIG. 4A may be carried out prior to (between FIG. 3C and FIG. 3D) the adding step (n– region forming step) of phosphorus shown in FIG. 3D.

Incidentally, the structure of this embodiment can be freely combined with any structure of the embodiments 1 to 9.

[Embodiment 11]

In this embodiment, a description will be made on an example in which the order of adding steps of an impurity element for forming a source region, a drain region, or an LDD region of a pixel TFT is made different from the embodiment 1.

First, after the state of FIG. 3B is obtained, the adding step (p++ region forming step) of boron shown in FIG. 4A is immediately carried out. Next, the adding step (n– region forming step) of phosphorus shown in FIG. 3D is carried out, and then, the adding step (n+ region forming step) of phosphorus shown in FIG. 3C is carried out.

Also, after the state of FIG. 3B is obtained, the adding step (n– region forming step) of phosphorus shown in FIG. 3D is immediately carried out. Next, the adding step (p++ region forming step) of born shown in FIG. 4A is carried out, and then, the adding step (n+ region forming step) of phosphorus shown in FIG. 3C is carried out. The order as described above is also possible.

In the case of this embodiment, since the adding step (n+ region forming step) of phosphorus is carried out last, a side wall used for a mask is made to remain as it is at a side wall of the gate wiring. For that reason, when this embodiment is carried out, as a material of the side wall, it is preferable to use an insulating film such as a silicon oxide film, a silicon nitride film, or a silicon oxide nitride film. When a semiconductor film such as a silicon film is used, there is a fear that a parasitic capacitance is formed between the side wall and the active layer.

Of course, it does not matter if a step of removing the side wall is added after the adding step (n+ region forming step) of phosphorus is carried out.

However, when the side wall is made to remain, there is a merit that a step of the gate wiring does not become acute. Thus, it is possible to prevent a cusp (nest) or the like from being produced by poor covering when an insulating film is formed on the gate wiring.

Incidentally, the structure of this embodiment can be freely combined with any structure of the embodiments 1 to 9.

[Embodiment 12]

In this embodiment, a description will be made on an example of a case where a crystalline silicon film is formed by means different from the embodiment 1.

In the embodiment 1, a catalytic element (nickel) is used for crystallization of an amorphous semiconductor film (specifically an amorphous silicon film). In this embodiment, a case where crystallization is made without using a catalytic element will be described.

In the case of this embodiment, after an amorphous silicon film is formed, a heat treatment at a temperature of 580 to 640° C. (typically 600° C.) for 12 to 30 hours to (typically 16 to 24 hours) is carried out to make crystallization, so that a crystalline silicon film is obtained. Thus, a gettering step as described in the embodiment 1 can be omitted.

When the structure of the present invention can be realized in this way, it is easy to combine a process using a crystalline silicon film, so-called high temperature polysilicon, with the present invention.

Incidentally, the structure of this embodiment can be freely combined with any structure of the embodiments 1 to 11.

[Embodiment 13]

Figure 18A:
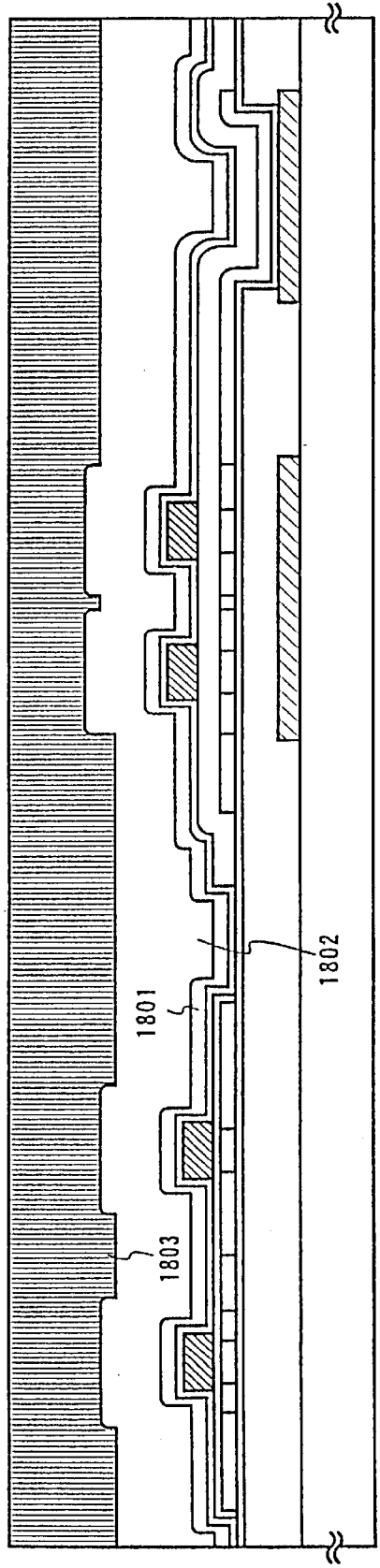
FIGS. 18A and 18B are views showing fabricating steps of an AM-LCD.
Figure 18B:
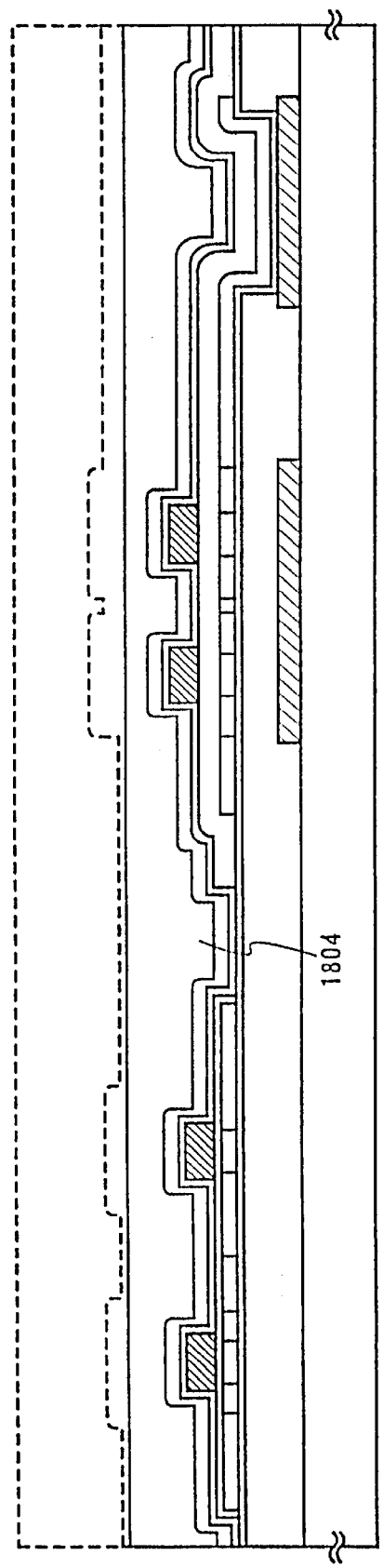

In this embodiment, a description will be made on an example in which a first interlayer insulating film is formed by a method different from the embodiment 1. FIGS. 18A and 18B are used for the description.

First, in accordance with the fabricating steps of the embodiment 1, steps up to the activating step shown in FIG. 4B are completed. Next, a silicon nitride oxide film 1801 having a thickness of 50 to 100 nm (in this embodiment, 70 nm) is formed, and a silicon nitride oxide film 1802 having a thickness of 600 nm to 1 μm (in this embodiment, 800 nm) is formed thereon. Further, a resist mask 1803 is formed thereon (FIG. 18A).

The silicon nitride oxide film 1801 is different from the silicon nitride oxide film 1802 in the composition ratio of nitrogen, oxygen, hydrogen, and silicon contained therein. The silicon nitride oxide film 1801 contains nitrogen of 7%, oxygen of 59%, hydrogen of 2%, and silicon of 32%. The silicon nitride oxide film 1802 contains nitrogen of 33%, oxygen of 15%, hydrogen of 23%, and silicon of 29%. Of course, the present invention is not limited to this composition ratio.

Since the resist mask 1803 is thick, it is possible to completely flatten the undulation of the surface of the silicon nitride oxide film 1802.

Next, by a dry etching method using a mixed gas of carbon tetrafluoride and oxygen, the resist mask 1803 and the silicon nitride oxide film 1802 are etched. In the case of this embodiment, in the dry etching using the mixed gas of carbon tetrafluoride and oxygen, etching rates of the silicon nitride oxide film 1802 and the resist mask 1803 are almost equal to each other.

By this etching step, as shown in FIG. 18B, the resist mask 1803 is completely removed, and the silicon nitride oxide film 1802 is partially etched (to the depth of 300 nm from the surface). As a result, the flatness of the surface of the resist mask 1803 is directly reflected in the flatness of the surface of the etched silicon nitride oxide film 1802.

In this way, a first interlayer insulating film 1804 having extremely high flatness is obtained. In the case of this embodiment, the thickness of the first interlayer insulating film 1804 is 500 nm. The fabricating steps of the embodiment 1 may be referred to for the subsequent steps.

Incidentally, the structure of this embodiment can be freely combined with any structure of the embodiments 1 to 12.

[Embodiment 14]

The present invention can also be used when a TFT is formed on an interlayer insulating film which is formed on a conventional MOSFET. That is, it is also possible to realize a semiconductor device with a three-dimensional structure in which a reflective type AM-LCD is formed on a semiconductor circuit.

The semiconductor circuit may be formed on a SOI substrate such as SIMOX, Smart-Cut (registered trademark of SOITEC Inc.), or ELTRAN (registered trademark of Cannon Inc.).

Incidentally, in carrying out this embodiment, any structure of the embodiments 1 to 13 may be combined.

[Embodiment 15]

The present invention can also be applied to an active matrix type EL (electroluminescence) display (also called an EL display device). An example is shown in FIG. 19.

Figure 19:
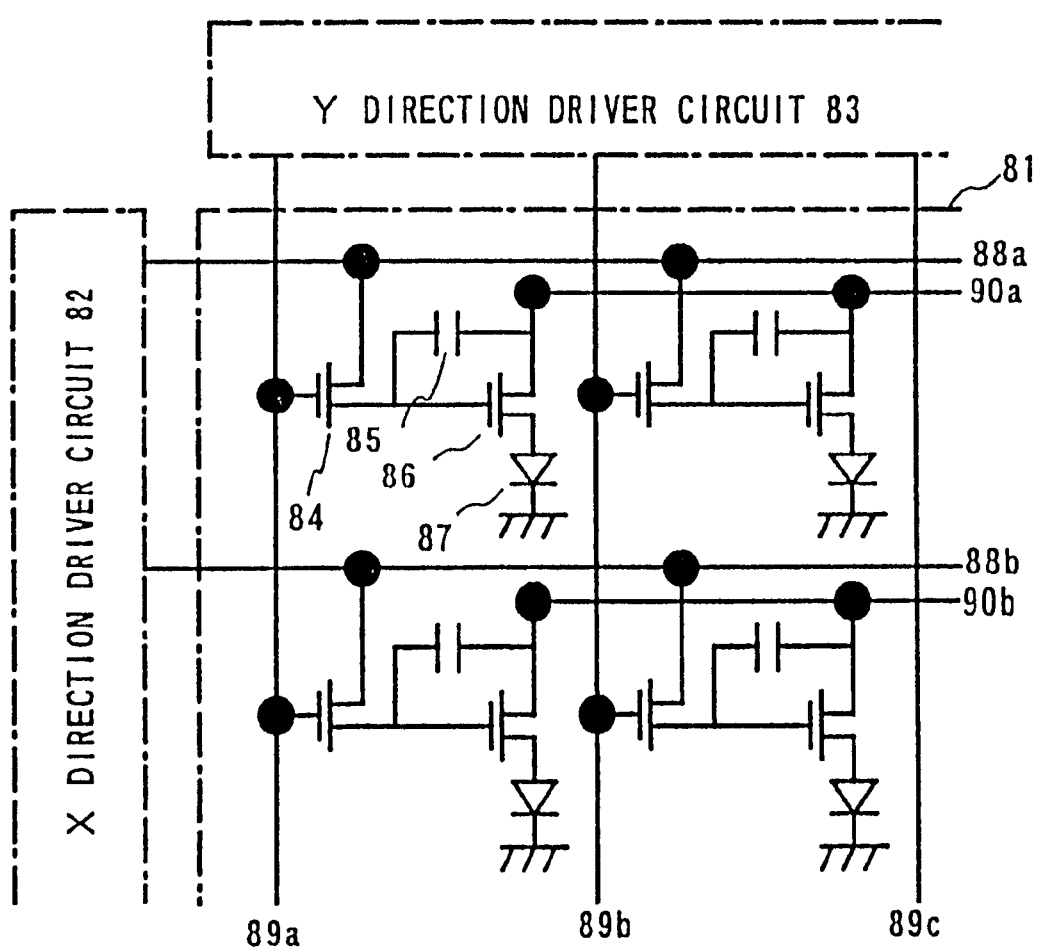
FIG. 19 is a view showing a circuit structure of an EL display device.

FIG. 19 is a circuit diagram of an active matrix type EL display. Reference numeral 81 designates a display region, and an X-direction (gate side) driver circuit 82 and a Y-direction (source side) driver circuit 83 are provided on its periphery. Each pixel in the display region 81 includes a switching TFT 84, a capacitor 85, a current controlling TFT 86, and an EL element 87. An X-direction signal line (gate signal line) 88a (or 88b) and a Y-direction signal line (source signal line) 89a (or 89b, 89c) are connected to the switching TFT 84. A power source line 90a or 90b is connected to the current controlling TFT 86.

In the active matrix type EL display of this embodiment, the gate insulating film of the TFT used for the X-direction driver circuit 82 or the Y-direction driver circuit 83 is thinner than the gate insulating film of the switching TFT 84 or of the current controlling TFT 86. The capacitor 85 is formed of the storage capacitor of the present invention.

Incidentally, the active matrix type EL display of this embodiment may be combined with any structure of the embodiments 1 to 3 and 5 to 14.

[Embodiment 16]

Figure 20A:
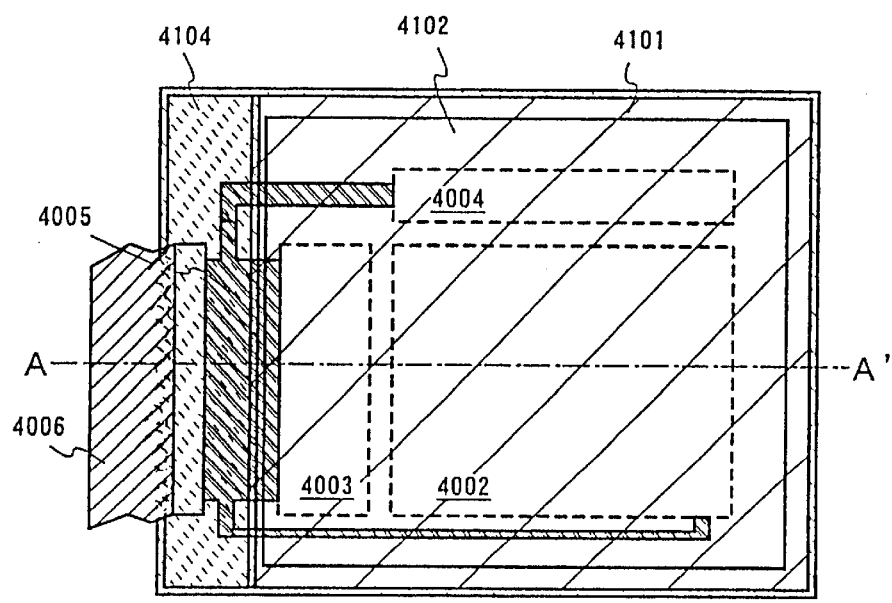
FIGS. 20A and 20B are views showing an upper surface structure and a sectional structure of an EL display device, respectively.

In this embodiment, a description will be made on an example in which an EL (electroluminescence) display device is fabricated by using the present invention. FIG. 20A is a top view of an EL display device of the present invention, and FIG. 20B is its sectional view.

In FIG. 20A, reference numeral 4001 designates a substrate; 4002, a pixel region; 4003, a source side driver circuit; and 4004, a gate side driver circuit. The respective driver circuits lead to an FPC (Flexible Printed Circuit) 4006 through a wiring 4005 and are connected to an external equipment.

At this time, a first sealing material 4101, a cover material 4102, a filler 4103, and a second sealing material 4104 are provided so as to surround the pixel region 4002, the source side driver circuit 4003, and the gate side driver circuit 4004.

Figure 20B:
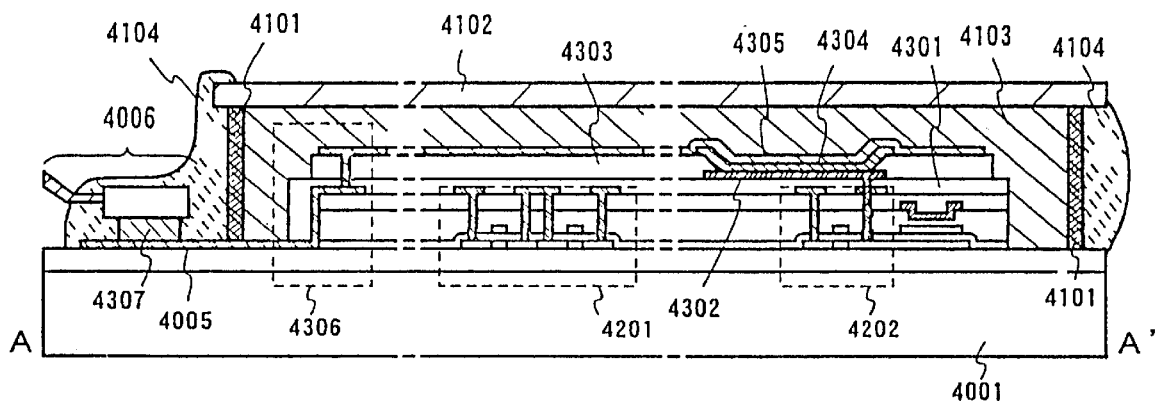

FIG. 20B is a sectional view taken along the line A–A' of FIG. 20A. A driver TFT (here, an n-channel TFT and a p-channel TFT are shown) 4201 included in the source side driver circuit 4003 and a pixel TFT (here, a TFT for controlling an electric current to an EL element is shown) 4202 included in the pixel region 4002 are formed on the substrate 4001.

In this embodiment, a TFT having the same structure as the driver circuit of FIG. 1 is used for the driver TFT 4201. A TFT having the same structure as the pixel region of FIG. 1 is used for the pixel TFT 4202.

An interlayer insulating film (flattening film) 4301 comprising a resin material is formed on the driver TFT 4201 and the pixel TFT 4202, and a pixel electrode (anode) 4302 electrically connected to the drain of the pixel TFT 4202 is formed thereon. As the pixel electrode 4302, a transparent conductive film having a large work function is used. As the transparent conductive film, a compound of indium oxide and tin oxide or a compound of indium oxide and zinc oxide can be used.

An insulating film 4303 is formed on the pixel electrode 4302, and an opening portion is formed in the insulating film 4303 over the pixel electrode 4302. At this opening portion, an EL (electroluminescence) layer 4304 is formed on the pixel electrode 4302. As the EL layer 4304, a well-known organic EL material or an inorganic EL material may be used. The organic EL material includes a low molecular (monomer) material and a high molecular (polymer) material, and any of them may be used.

A well-known technique may be used as a method of forming the EL layer 4304. The structure of the EL layer may be comprising a laminate structure by freely combining a hole injection layer, a hole transport layer, a light emitting layer, an electron transport layer, and an electron injection layer. Alternatively, the EL layer may have a single-layer structure.

A cathode 4305 comprising a conductive film having a light-shielding property (typically, a conductive film containing aluminum, copper or silver as its main ingredient, or a laminate film of the foregoing film and other conductive films) is formed on the EL layer 4304. It is desirable that moisture and oxygen existing at the interface between the cathode 4305 and the EL layer 4304 are removed to the utmost degree. Thus, such contrivance is necessary that both are continuously formed in vacuum, or the EL layer 4304 is formed in a nitrogen or inert gas atmosphere and the cathode 4305 is formed while the EL layer is not brought into contact with oxygen or moisture. In this embodiment, a multi-chamber system (cluster tool system) film forming apparatus is used so that the foregoing film formation is made possible.

The cathode 4305 is electrically connected to the wiring 4005 in a region designated by 4306. The wiring 4005 is a wiring for applying a predetermined voltage to the cathode 4305, and is electrically connected to the FPC 4006 through a conductive material 4307.

In the manner as described above, the EL element comprising the pixel electrode (anode) 4302, the EL layer 4304, and the cathode 4305 is formed. This EL element is surrounded by the first sealing material 4101 and the cover material 4102 bonded to the substrate 4001 by the first sealing material 4101, and is sealed by the filler 4103.

As the cover material 4102, a glass plate, a metal plate (typically, a stainless plate), a ceramic plate, an FRP (Fiberglass-Reinforced Plastics) plate, a PVF (polyvinyl fluoride) film, a Mylar film, a polyester film, or an acrylic film may be used. It is also possible to use a sheet having such a structure that an aluminum foil is sandwiched between PVF films or Mylar films.

However, in the case where radiation direction of light from the EL element is directed toward the cover material side, the cover material must be transparent. In that case, a transparent material such as a glass plate, a plastic plate, a polyester film, or an acrylic film is used.

As the filler 4103, an ultraviolet ray curing resin or a thermosetting resin may be used, and PVC (polyvinyl chloride), acryl, polyimide, epoxy resin, silicone resin, PVB (polyvinyl butyral), or EVA (ethylene-vinyl acetate) may be used. If a moisture absorbing material (preferably barium oxide) is provided in the inside of the filler 4103, deterioration of the EL element can be suppressed.

A spacer may be contained in the filler 4103. At this time, if the spacer is comprising barium oxide, it is possible to make the spacer itself have a moisture absorption property. In the case where the spacer is provided, it is also effective to provide a resin film, as a buffer layer to relieve pressure from the spacer, on the cathode 4305.

The wiring 4005 is electrically connected to the FPC 4006 through the conductive material 4307. The wiring 4005 transmits a signal sent to the pixel region 4002, the source side driver circuit 4003, and the gate side driver circuit 4004 to the FPC 4006, and is electrically connected to an external equipment through the FPC 4006.

In this embodiment, the second sealing material 4104 is provided so as to cover an exposed portion of the first sealing material 4101 and a part of the FPC 4006, and such a structure as to thoroughly isolate the EL element from the outer air is obtained. In this way, the EL display device having the sectional structure of FIG. 20B is obtained. The EL display device of this embodiment may be fabricated by combining any structure of the embodiments 1 to 3 or 5 to 14.

[Embodiment 17]

In this embodiment, examples of pixel structures used for the pixel region of the EL display device shown in the embodiment 16 will be described with reference to FIGS. 21A to 21C. In this embodiment, reference numeral 4401 designates a source wiring of a switching TFT 4402; 4403, a gate wiring of the switching TFT 4402; 4404, a current controlling TFT; 4405, a capacitor; 4406, 4408, current supply lines; and 4407, an EL element.

Figure 21A:
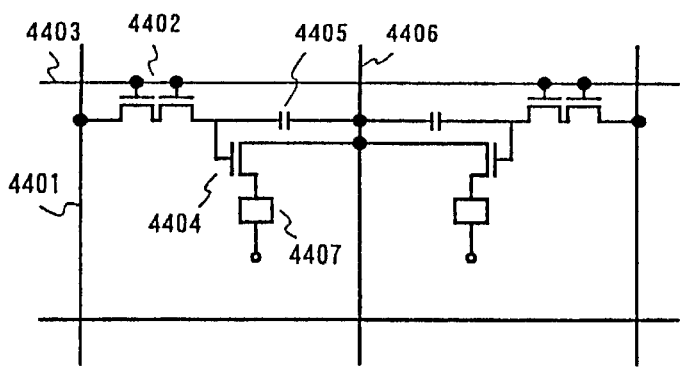
FIGS. 21A to 21C are views respectively showing the structure of a pixel region of an EL display device.

FIG. 21A shows an example in which the current supply line 4406 is made common to two pixels. That is, this example is characterized in that two pixels are formed to become linearly symmetrical with respect to the current supply line 4406. In this case, since the number of power supply lines can be reduced, the pixel region can be made further fine.

Figure 21B:
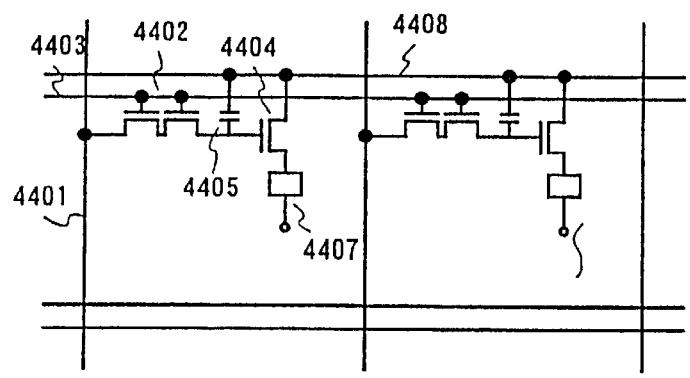

FIG. 21B shows an example in which the current supply line 4408 is provided in parallel with the gate wiring 4403. In FIG. 21B, although such a structure is adopted that the current supply line 4408 and the gate wiring 4403 do not overlap with each other, if both are wirings formed in different layers, it is also possible to provide the wirings so that both are overlapped with each other through an insulating film. In this case, since an occupied area can be made common to the power source supply line 4408 and the gate wiring 4403, the pixel region can be made further fine.

Figure 21C:
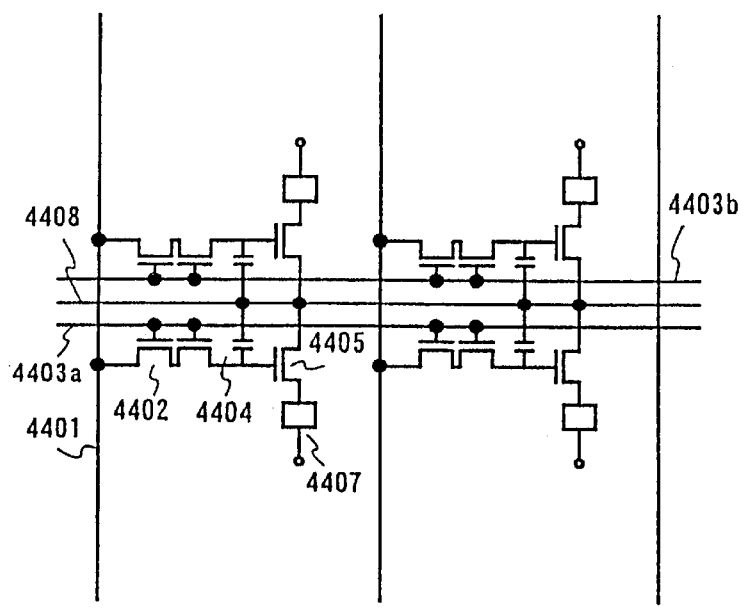

FIG. 21C is characterized in that similarly to the structure of FIG. 21B, the current supply line 4408 is provided to be in parallel with the gate wirings 4403, and further, two pixels are formed to become linearly symmetrical with respect to the current supply line 4408. It is also effective to provide the current supply line 4408 so that it overlaps with either one of the gate wirings 4403. In this case, since the number of power supply lines can be decreased, the pixel region can be made further fine.

[Embodiment 18]

It is possible to use electro-optical devices or semiconductor circuits of the present invention as display sections of the electric equipments or signal processing circuits. Such an electronic equipment includes video cameras, digital cameras, projectors, projection televisions, goggle type displays (head mount displays), navigation systems, acoustic reproduction devices, note-type personal computers, game equipments, portable information terminals (such as mobile computers, portable telephones, portable-type game equipments or electronic books), and image reproduction devices having a recording medium, etc. Some examples of these electric equipments are shown in FIGS. 22A to 24B.

Figure 22A:
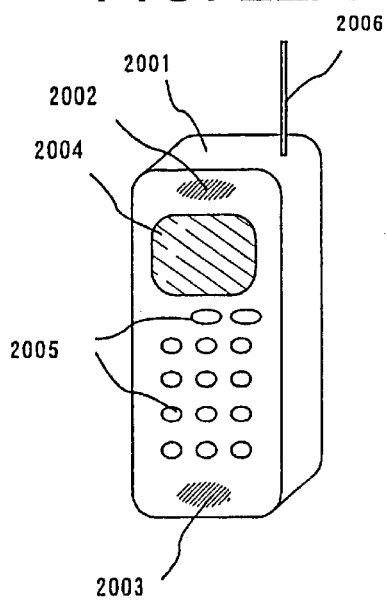
FIGS. 22A to 22F are views showing examples of electronic instruments.

FIG. 22A shows a portable telephone, which is composed of a main body 2001, a sound output section 2002, a sound input section 2003, a display section 2004, operation switches 2005, and an antenna 2006. The electro-optical devices of the present invention can be applied to the display section 2004 and the semiconductor circuits of the present invention can be applied to the sound output section 2002, the sound input section 2003, or CPU and memories or the like.

Figure 22B:
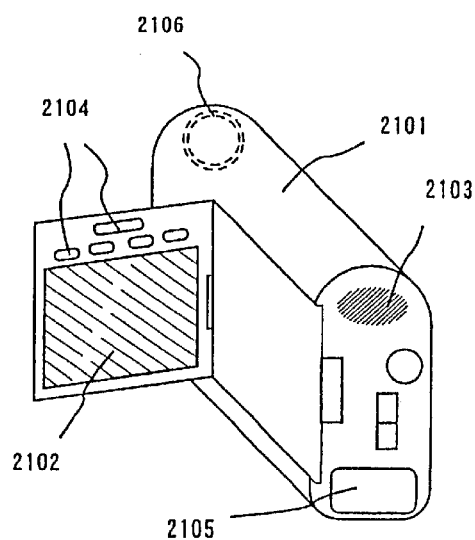

FIG. 22B shows a video camera, which is composed of a main body 2101, a display section 2102, a sound input section 2103, operation switches 2104, a battery 2105, and an image receiving section 2106. The electro-optical devices of the present invention can be applied to the display section 2102 and the semiconductor circuits of the present invention can be applied to the sound input section 2103 or CPU and memories or the like.

Figure 22C:
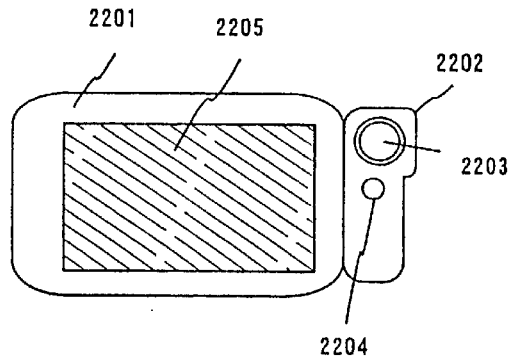

FIG. 22C shows a mobile computer, which is composed of a main body 2201, a camera section 2202, an image receiving section 2203, operation switches 2204, and a display section 2205. The electro-optical devices of the present invention can be applied to the display section 2205 and the semiconductor circuits of the present invention can be applied to CPU and memories or the like.

Figure 22D:
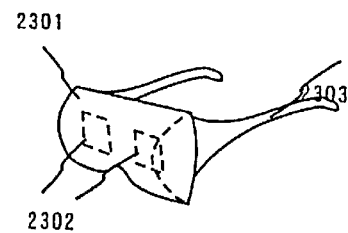

FIG. 22D shows a goggle type display, which is composed of a main body 2301, a display section 2302, and an arm section 2303. The electro-optical devices of the present invention can be applied to the display section 2302 and the semiconductor circuits of the present invention can be applied to CPU and memories or the like.

Figure 22E:
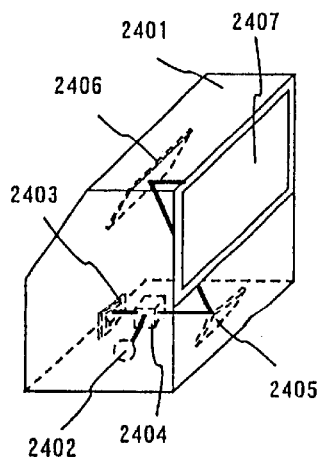

FIG. 22E shows a rear type projector (projection television), which is composed of a main body 2401, a light source 2402, a display device 2403, a polarizing beam splitter 2404, reflectors 2405 and 2406 and a screen 2407. The present invention may be applied to the display device 2403, and the semiconductor circuits of the present invention may be applied to CPU and memories or the like.

Figure 22F:
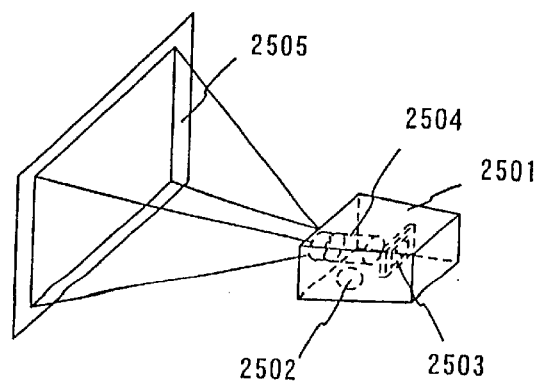

FIG. 22F shows a front type projector, which is composed of a main body 2501, a light source 2502, a display device 2503, an optical system 2504 and a screen 2505. The present invention can be applied to the display device 2503, and the semiconductor circuits of the present invention can be applied to CPU and memories or the like.

Figure 23A:
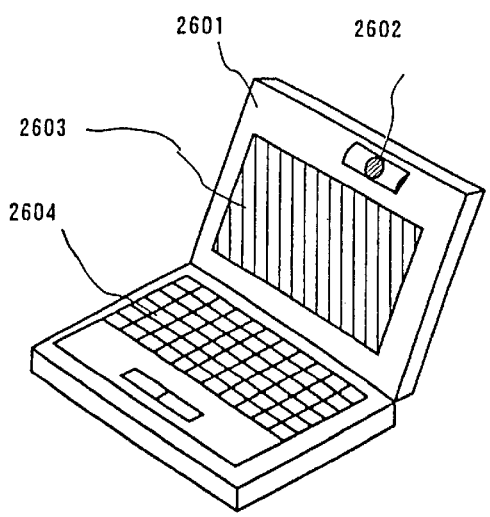
FIGS. 23A to 23D are views showing examples of electronic instruments.

FIG. 23A shows a personal computer, which is composed of a main body 2601, an image input section 2602, a display section 2603, a keyboard 2604, etc. The electro-optical device of the present invention can be applied to the display section 2603, and the semiconductor circuits of the present invention can be applied to CPU and memories or the like.

Figure 23B:
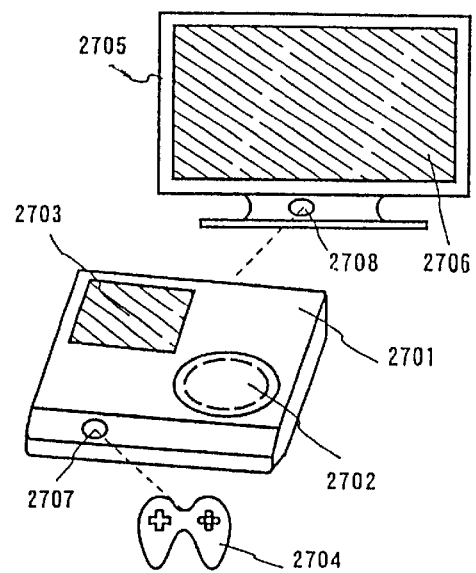

FIG. 23B shows an electronic game equipment (a game equipment) comprising a main body 2701, a recording medium 2702, a display section 2703 and a controller 2704. The sound and the image outputted from the electronic game equipment are reproduced in the display having a body 2705 and a display section 2706. As communication means between the controller 2704 and the main body 2701 or the electronic game equipment and the display, wired communication, wireless communication or optical communication may be used. In this embodiment, there is employed such a structure that an infrared radiation is detected in sensor portions 2707 and 2708. The electro-optical device of the present invention can be applied to the display sections 2703 and 2706, and the semiconductor circuits of the present invention can be applied to CPU and memories or the like.

Figure 23C:
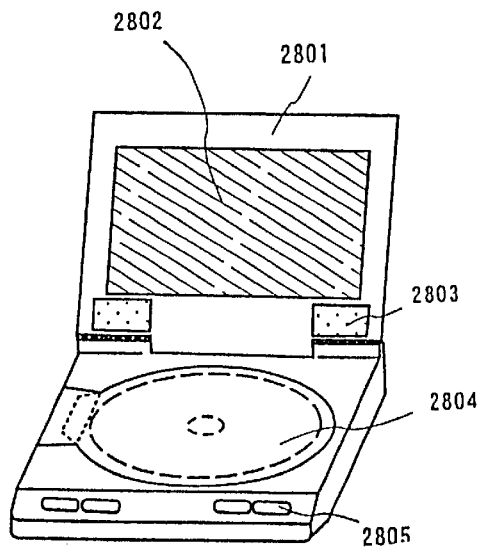

FIG. 23C shows a player (an image reproduction device) which uses a recording medium on which a program is recorded (hereinafter referred to as a recording medium), and is composed of a main body 2801, a display section 2802, a speaker section 2803, a recording medium 2804 and operation switches 2805. Note that a DVD (digital versatile disk), CD or the like as a recording medium for this device, and that it can be used for music appreciation, film appreciation, games, and the Internet. The electro-optical device of the present invention can be applied to the display section 2802, CPU and memories or the like.

Figure 23D:
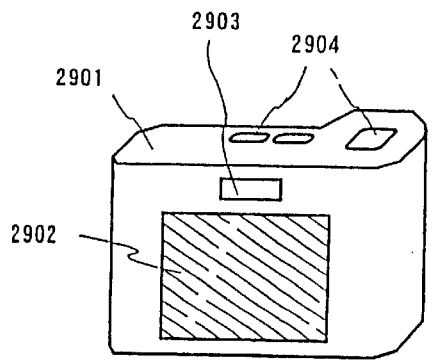

FIG. 23D shows a digital camera, which is composed of a main body 2901, a display section 2902, an eyepiece section 2903, operation switches 2904 and an image receiving section (not shown). The electro-optical device of the present invention can be applied to the display section 2902, CPU and memories or the like.

Figure 24A:
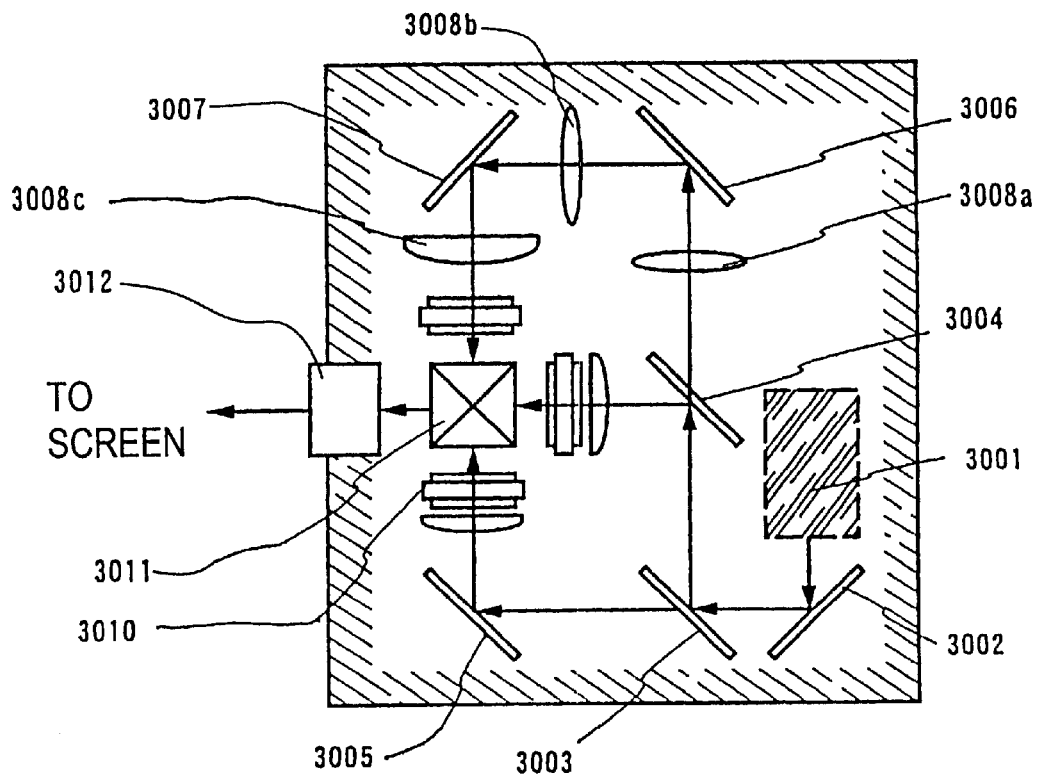
FIGS. 24A and 24B are views showing the structure of an optical engine.
Figure 24B:
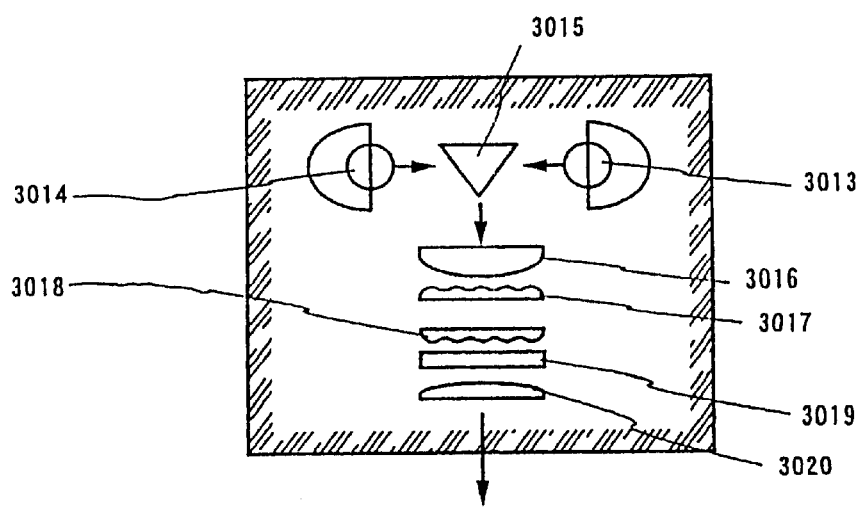

The detailed description of an optical engine that is applicable to the rear type projector in FIG. 22E and the front type projector in FIG. 22F is shown in FIGS. 24A and 24B. FIG. 24A is an optical engine and FIG. 24B is a light source optical system incorporated to the optical engine.

The optical engine shown in FIG. 24A consists of a light source optical system 3001, mirrors 3002 and 3005 to 3007, dichroic mirrors 3003 and 3004, optical lenses 3008*a* to 3008*c*, a prism 3011, a display device 3010 and an optical projection system 3012. The optical projection system 3012 is composed of an optical system provided with a projection lens. This embodiment shows an example in which the display device 3010 is a "three plate type" using three lenses, but a "simple plate type" is also acceptable. Further, the operator may provide optical lenses, a film having a polarization function, a film to regulate the phase difference or IR films, etc., within the optical path shown by an arrow in FIG. 24A.

As shown in FIG. 24B, the light source optical system 3001 is composed of light sources 3013 and 3014, a compound prism 3015, collimator lenses 3016 and 3020, lens arrays 3017 and 3018, and a polarizing conversion element 3019. Note that the light source optical system shown in FIG. 24B uses two light sources, but a single light source is acceptable. Three or more light sources may be used. Further, the operator may provide optical lenses, a film having polarization function, a film to regulate the phase difference or IR films, etc., suitably in the light path of the light source optical system.

As described above, an applicable range of the present invention is extremely wide, and it can be applied to electric equipments in all fields. Further, the manufacture of the electric equipment of this embodiment can be realized by using a structure in combination with any of embodiments 1 to 17.

By using the present invention, TFTs including gate insulating films having different thicknesses can be formed on the same substrate. Thus, in an electro-optical device typified by an AM-LCD, or a semiconductor device including an electronic instrument having such an electro-optical device as a display portion (display), circuits having suitable performance can be arranged according to the specifications required by the circuits, and the performance and reliability of the semiconductor device can be greatly improved.

Moreover, in the pixel region of the electro-optical device, the dielectric of the storage capacitor can be made thin, and the storage capacitor having large capacity can be formed in a small area. Further, the storage capacitor can be concealed under the gate wiring or source wiring. Thus, even in the electro-optical device including a display portion having a size of 1 inch or less in diagonal, it becomes possible to secure sufficient storage capacitor without lowering the opening ratio.

What is claimed is:

1. A semiconductor device comprising:
   a pixel portion including at least one pixel TFT, at least one storage capacitor, and a pixel electrode connected to the pixel TFT; and
   a driver circuit portion for driving said pixel portion, wherein the pixel portion comprises:
      an active layer of the pixel TFT;
      first conductive patterns over said active layer with an insulating film interposed therebetween;
      a first interlayer insulating film over said first conductive patterns;
      light-shielding films over the first conductive patterns with the first insulating film interposed therebetween;
      a second interlayer insulating film over the light-shielding films;
      a source wiring and a drain wiring on said second interlayer insulating film;
      a third interlayer insulating film covering said source wiring and said drain wiring; and
      a pixel electrode on said third interlayer insulating film,
      wherein said storage capacitor comprises a first storage capacitor and a second storage capacitor connected in parallel with each other,
      wherein said first storage capacitor comprises a portion of the active layer of said pixel TFT, the insulating film, and one of the first conductive patterns, and
      wherein said second storage capacitance comprises said one of the first conductive patterns, the first interlayer insulating film, and one of the light shielding films.

2. A device according to claim 1, wherein the insulating film comprises silicon, and has a thickness of 5 to 50 nm.

3. A device according to claim 1, wherein the thickness of the insulating film in the pixel region is equal to a thickness of a gate insulating film of a TFT included in said driver circuit portion.

4. A device according to claim 1, wherein said active layer and the portion comprise a semiconductor film.

5. A device according to claim 1, wherein said pixel electrode is selected from an anode and a cathode of an EL element.

6. An electronic instrument comprising a semiconductor device according to claim 5 as a display portion, wherein said electronic instrument is selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

7. An electronic instrument comprising a semiconductor device according to claim 1 as a display portion, wherein said electronic instrument is selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

8. A semiconductor device comprising:
   an active layer;
   a gate wiring provided opposite to said active layer with a first insulating film interposed therebetween;
   a first interlayer insulating film covering said gate wiring;
   an opening portion provided in said first interlayer insulating film;
   a second insulating film covering said opening portion;
   a light-shielding film provided opposite to said gate wiring with the second insulating film interposed therebetween;
   a second interlayer insulating film covering said light-shielding film;
   a source wiring and a drain wiring on said second interlayer insulating film;
   a third interlayer insulating film covering said source wiring and said drain wiring; and
   a pixel electrode on said third interlayer insulating film,
   wherein said active layer and said gate wiring form a first storage capacitor with said first insulating film interposed therebetween,
   wherein said gate wiring and said light-shielding film form a second storage capacitor with said second insulating film interposed therebetween, and
   wherein said active layer and said light-shielding film are electrically connected through said pixel electrode.

9. A device according to claim 8, wherein at least one of said first and said second insulating films comprises silicon, and has a thickness of 5 to 50 nm.

10. A device according to claim 8, wherein the thickness of said first insulating film is equal to the thickness of gate insulating films of at least some of TFTs which are included in a driver circuit.

11. A device according to claim 8, wherein said pixel electrode is selected from an anode and a cathode of an EL element.

12. An electronic instrument comprising a semiconductor device according to claim 11 as a display portion, wherein said electronic instrument is selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

13. An electronic instrument comprising a semiconductor device according to claim 8 as a display portion, wherein said electronic instrument is selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

14. A semiconductor device comprising:
   a semiconductor island over a substrate;
   first conductive patterns adjacent to the semiconductor island with a first insulating film interposed therebetween;
   a second insulating film over the first conductive patterns;
   second conductive patterns over the second insulating film;
   source and drain wirings over the second conductive patterns with a third insulating film interposed therebetween; and
   a pixel electrode over the source and drain wirings, the pixel electrode electrically connected to the semiconductor island and one of the second conductive patterns,
   wherein a first storage capacitor and a second storage capacitor are formed over the substrate, the first storage capacitor comprising a portion of the semiconductor island, the first insulating film, and one of the first conductive patterns and the second storage capacitor comprising the one of the first conductive patterns, the second insulating film, and another one of the second conductive patterns.

15. A device according to claim 14, wherein at least one of said first and said second insulating films comprise silicon.

16. A device according to claim 14, wherein the thickness of the first insulating film is 5 to 50 nm.

17. A device according to claim 14, wherein at least one of the first conductive patterns is a gate electrode of a thin film transistor formed over the substrate.

18. A device according to claim 14, wherein the semiconductor device is an EL display device.

19. A device according to claim 14, wherein said semiconductor device is at least one electronic equipment selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

20. A semiconductor device comprising:
   a pixel portion comprising a plurality of pixels formed over a substrate, each pixel comprising at least one pixel TFT, a pixel electrode electrically connected to the pixel TFT, and first and second storage capacitors connected in parallel with each other;
   at least one driver circuit formed over the substrate for driving said pixel portion, the driver circuit comprises at least one driver TFT,
   wherein a gate insulating film of the pixel TFT, a gate insulating film of the driver TFT, and an insulating layer of the first storage capacitor are made of the same layer over the substrate, and
   wherein a thickness of the insulating layer of the first storage capacitor is smaller than that of the gate insulating film of the pixel TFT.

21. A device according to claim 20, wherein the gate insulating film of the pixel TFT, the gate insulating film of the driver TFT, and the insulating layer of the first storage capacitor comprise silicon.

22. A device according to claim 20, wherein the thickness of the insulating layer of the first storage capacitor is 5 to 50 nm.

23. A device according to claim 20, wherein gate electrodes of the pixel TFT and the driver TFT comprise the same layer.

24. A device according to claim 20, wherein the semiconductor device is an EL display device.

25. A device according to claim 20, wherein said semiconductor device is at least one electronic equipment selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

26. A semiconductor device comprising:
   a semiconductor island over a substrate;
   a first insulating film over the semiconductor island;
   a plurality of first conductive patterns over the semiconductor island with the first insulating film interposed therebetween;
   a second insulating film over the first conductive patterns;
   a plurality of second conductive patterns over the first conductive patterns with the second insulating film interposed therebetween;
   a pixel electrode over the second conductive patterns, the pixel electrode electrically connected to the semiconductor island and one of the second conductive patterns.

27. A device according to claim 26, wherein at least one of said first and said second insulating films comprise silicon.

28. A device according to claim 26, wherein the thickness of the first insulating film is 5 to 50 nm.

29. A device according to claim 26, wherein the first conductive patterns are made of the same layer as gate electrodes of thin film transistors formed over the substrate.

30. A device according to claim 26, wherein the semiconductor device is an EL display device.

31. A device according to claim 26, wherein said semiconductor device is at least one electronic equipment selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

32. A semiconductor device comprising:
   a pixel portion comprising a plurality of pixels formed over a substrate, each pixel comprising at least one pixel TFT, a pixel electrode electrically connected to the pixel TFT, and first and second storage capacitors connected in parallel with each other;

at least one driver circuit formed over the substrate for driving said pixel portion, the driver circuit comprises at least one driver TFT, wherein the pixel portion comprises:
   an active layer of the pixel TFT;
   first conductive patterns over said active layer with an insulating film interposed therebetween;
   a first interlayer insulating film over said first conductive patterns;
   light-shielding films over the first conductive patterns with the first insulating film interposed therebetween;
   a second interlayer insulating film over the light-shielding films;
   a source wiring and a drain wiring on said second interlayer insulating film;
   a third interlayer insulating film covering said source wiring and said drain wiring; and
   a pixel electrode on said third interlayer insulating film, wherein one of light-shielding films is used as an upper electrode of the second storage capacitor, and wherein a thickness of a portion of the insulating film in the first storage capacitor is smaller than a thickness of another portion of the insulating film in the pixel TFT.

33. A device according to claim 32, wherein the insulating film comprises silicon.

34. A device according to claim 32, wherein the thickness of the insulating film in the first storage capacitor is 5 to 50 nm.

35. A device according to claim 32, wherein some of the first conductive patterns are used as gate electrodes of the pixel TFT and the driver TFT.

36. A device according to claim 32, wherein the semiconductor device is an EL display device.

37. A device according to claim 32, wherein said semiconductor device is at least one electronic equipment selected from the group consisting of a video camera, a digital camera, a projector, a projection television, a goggle type display, a head mount display, a navigation system, an acoustic reproduction device, a note-type personal computer, a game equipment, a portable information terminal, a mobile computer, a portable telephone, a portable-type game equipment, an electronic book, and an image reproduction devices having a recording medium.

* * * * *